United States Patent [19]
Itoh

[11] Patent Number: 6,016,274
[45] Date of Patent: Jan. 18, 2000

[54] SEMICONDUCTOR MEMORY DEVICE

[75] Inventor: Yasuo Itoh, Kawasaki, Japan

[73] Assignee: Kabushiki Kaisha Toshiba, Kawasaki, Japan

[21] Appl. No.: 09/044,989

[22] Filed: Mar. 20, 1998

Related U.S. Application Data

[62] Division of application No. 08/402,055, Mar. 10, 1995, Pat. No. 5,784,315.

[30] Foreign Application Priority Data

Mar. 11, 1994 [JP] Japan .................................... 6-040935

[51] Int. Cl.$^7$ .................................................. G11C 16/00
[52] U.S. Cl. ............................... 365/185.29; 365/185.19; 365/185.22
[58] Field of Search ......................... 365/185.29, 185.22, 365/185.19

[56] References Cited

U.S. PATENT DOCUMENTS

| | | | |
|---|---|---|---|
| 4,357,685 | 11/1982 | Daniele et al. ..................... | 365/185.22 |
| 4,718,041 | 1/1988 | Baglee et al. ...................... | 365/185.22 |
| 4,811,294 | 3/1989 | Kobayashi et al. ................ | 365/185.22 |
| 4,937,787 | 6/1990 | Kobatake ........................... | 365/185.22 |
| 4,943,962 | 7/1990 | Imamiya et al. ................... | 365/230.08 |
| 4,958,317 | 9/1990 | Terado et al. ............................. | 365/104 |
| 5,105,384 | 4/1992 | Noguchi et al. ......................... | 365/185 |
| 5,124,945 | 6/1992 | Schreck .............................. | 365/185.22 |
| 5,200,920 | 4/1993 | Norman et al. .................... | 365/185.19 |
| 5,218,559 | 6/1993 | Banks ................................. | 365/185.22 |
| 5,247,480 | 9/1993 | Itoh et al. .......................... | 365/189.09 |
| 5,257,225 | 10/1993 | Lee ..................................... | 365/185.19 |
| 5,258,949 | 11/1993 | Chang et al. ...................... | 365/185.22 |
| 5,293,350 | 3/1994 | Kim et al. ............................. | 365/238.5 |
| 5,299,162 | 3/1994 | Kim et al. .......................... | 365/185.22 |
| 5,321,699 | 6/1994 | Endoh et al. ...................... | 365/185.22 |
| 5,357,462 | 10/1994 | Tanaka et al. ..................... | 365/185.22 |
| 5,361,277 | 11/1994 | Tanaka et al. ..................... | 365/189.01 |
| 5,369,615 | 11/1994 | Harari et al. ....................... | 365/185.19 |
| 5,379,256 | 1/1995 | Tanaka et al. ..................... | 365/185.22 |
| 5,388,084 | 2/1995 | Itoh et al. .......................... | 365/185.23 |
| 5,414,658 | 5/1995 | Challa .................................... | 365/185 |
| 5,452,249 | 9/1995 | Miyamoto et al. ..................... | 365/185 |
| 5,463,586 | 10/1995 | Chao et al. ........................ | 365/185.22 |
| 5,467,309 | 11/1995 | Tanaka et al. ..................... | 365/185.14 |
| 5,475,249 | 12/1995 | Watsuji et al. .................... | 365/185.22 |
| 5,487,033 | 1/1996 | Keeney et al. .................... | 365/185.19 |
| 5,555,204 | 9/1996 | Endoh et al. ...................... | 365/189.01 |
| 5,557,568 | 9/1996 | Miyamoto et al. ................ | 365/185.22 |
| 5,568,439 | 10/1996 | Harari ................................ | 365/185.29 |

FOREIGN PATENT DOCUMENTS

| | | |
|---|---|---|
| 0 642 133 | 3/1995 | European Pat. Off. . |
| 2 264 578 | 9/1993 | United Kingdom . |

*Primary Examiner*—Tan T. Nguyen
*Attorney, Agent, or Firm*—Banner & Witcoff

[57] ABSTRACT

The semiconductor memory device of the present invention includes a memory cell having a floating gate and a control gate, for maintaining data by shifting the threshold value. In the test mode, the data read from the memory cell is verified by the verify circuit. If the result of verify is not approved, the writing of data is carried out again. The number of times of such writing is counted by the count circuit. In the data table, various correlations between the numbers of times of write and write voltages are stored. The write voltage data corresponding to the number of times of write from the count circuit is selectively output from the data table. The write voltage data is written in the memory element by the write circuit. The voltage at the other terminal of the voltage limiting circuit for varying the write voltage, is divided into several voltages, and thus the write voltage can be varied. The control circuit controls the dividing circuit such as to set the write voltage indicated by the write voltage data in the memory element in the write mode. Thus, the write voltage is optimized, and the appropriate number of times of write can be performed.

15 Claims, 20 Drawing Sheets

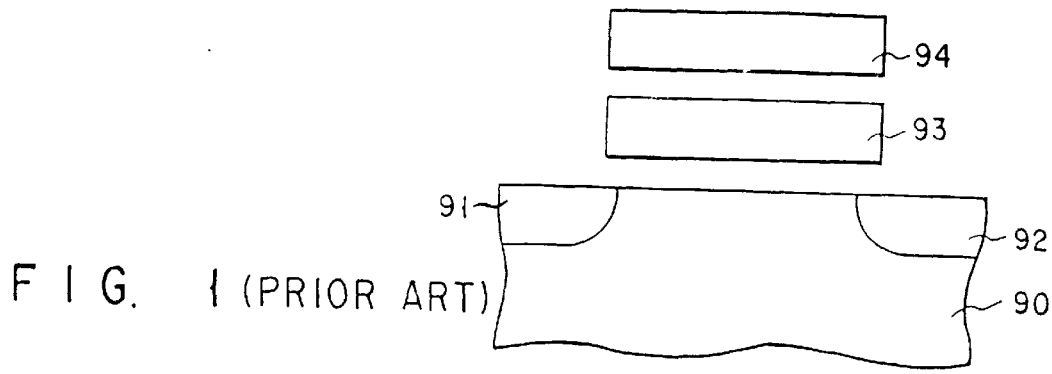
F I G. 1 (PRIOR ART)
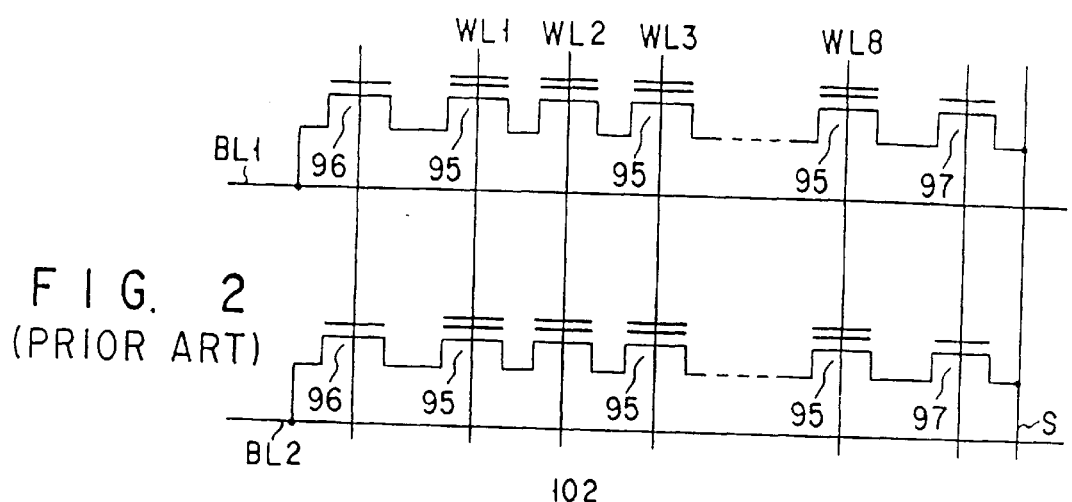
F I G. 2 (PRIOR ART)
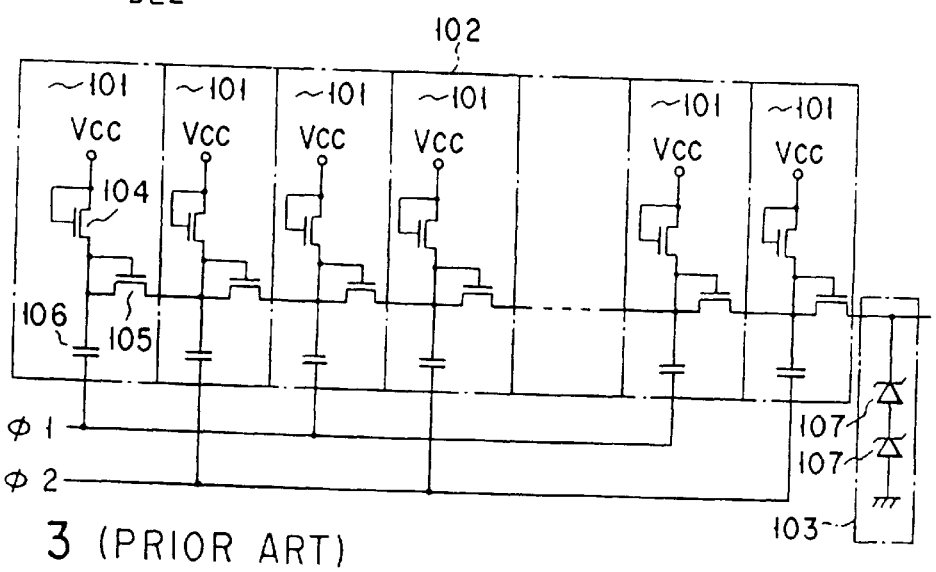
F I G. 3 (PRIOR ART)
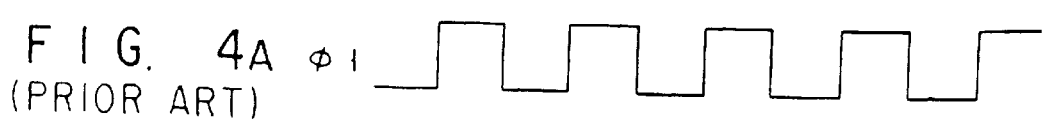
F I G. 4A (PRIOR ART) φ1
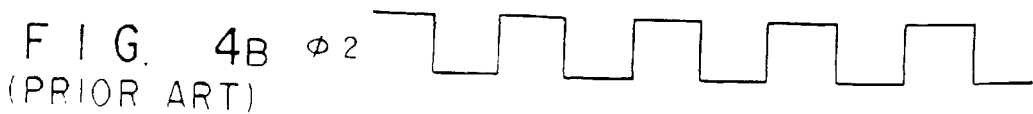
F I G. 4B (PRIOR ART) φ2

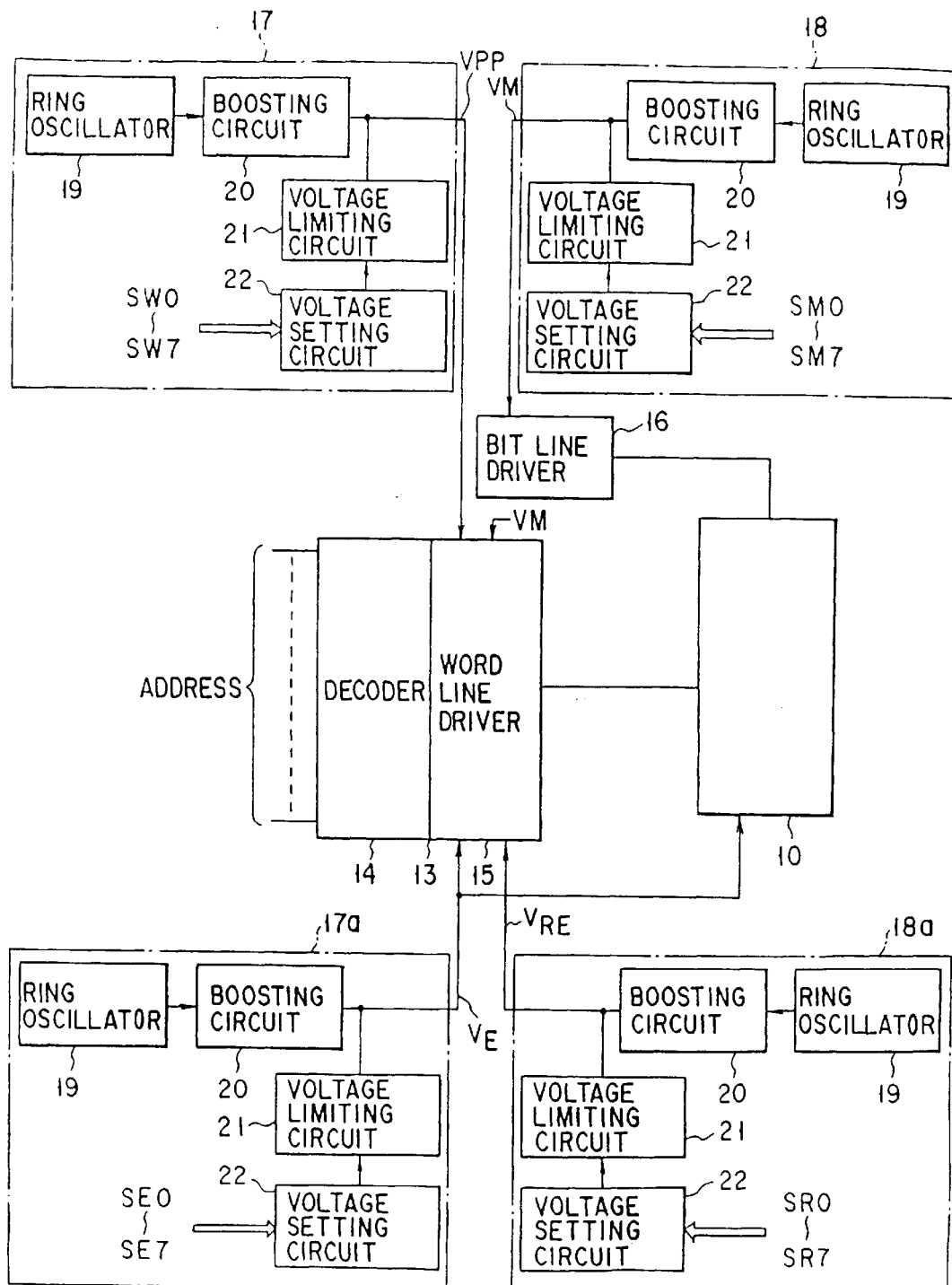
F I G. 5 A

|          | READ OUT | WRITE | ERASE |
|----------|----------|-------|-------|
| SIGNAL A | VCC      | VCC   | GND   |
| SIGNAL B | GND      | GND   | VCC   |
| SIGNAL C | GND      | GND   | VPP   |
| SIGNAL D | VCC      | GND   | GND   |
| SIGNAL E | GND      | VCC   | GND   |
| SOURCE VA | VCC     | VPP   | VPP   |
| SOURCE VB | VCC     | VPI   | VCC   |
| SOURCE VC | VCC     | VCC   | VPP   |
F I G. 5G
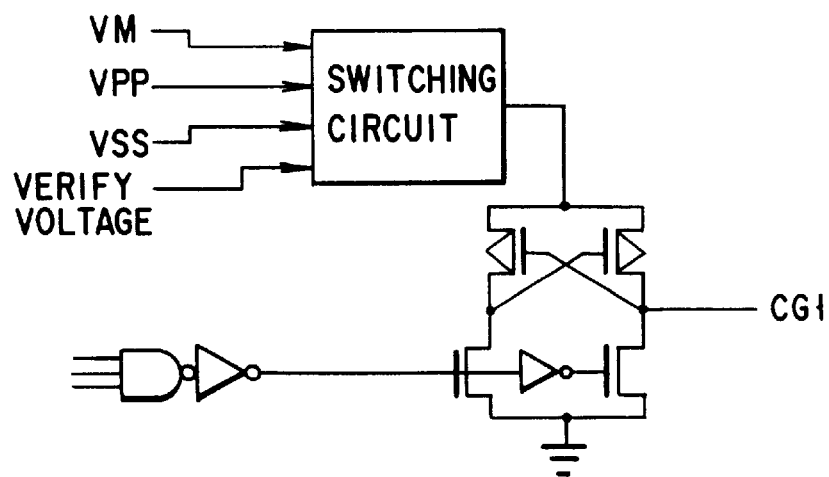
F I G. 5H

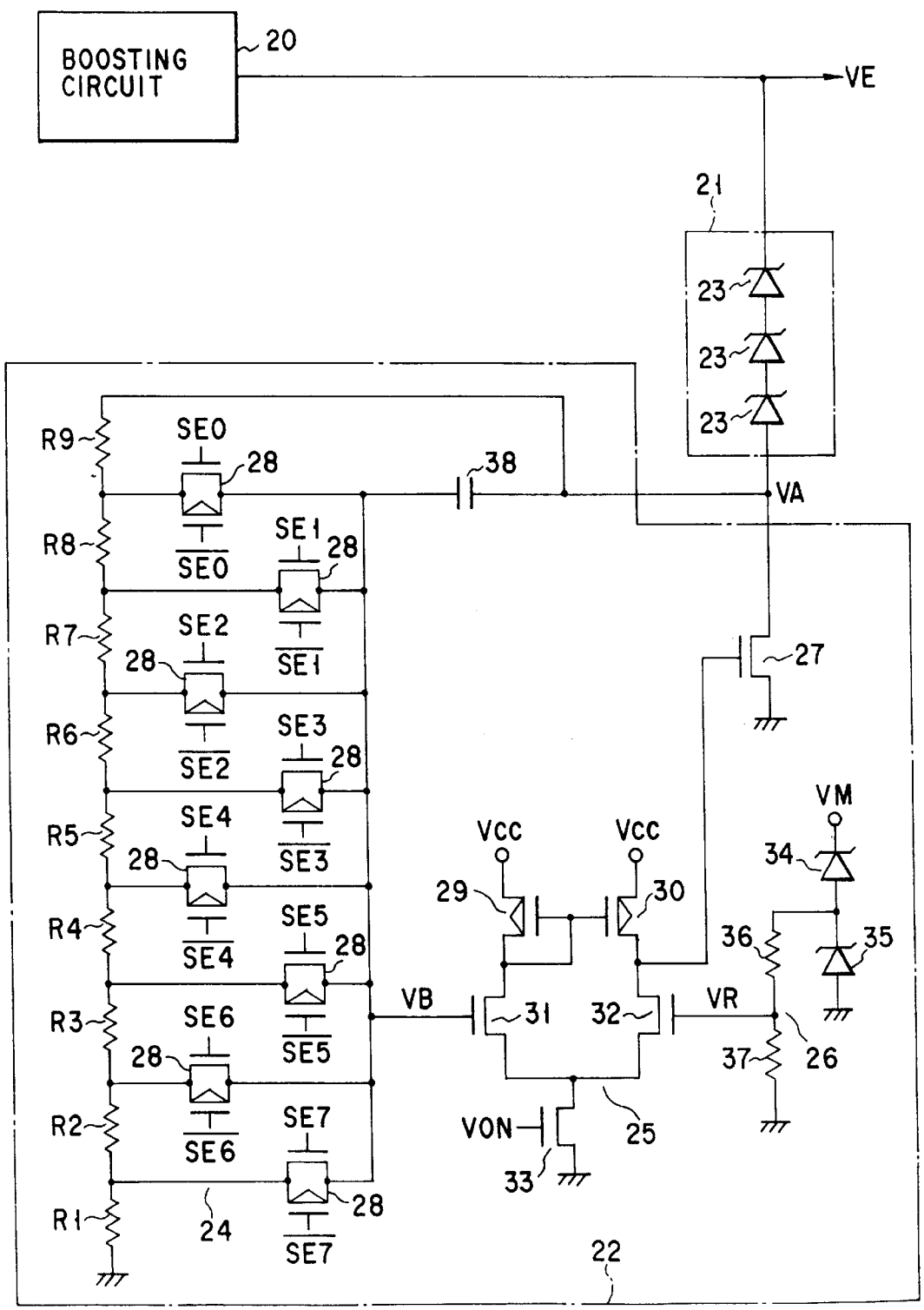
F I G. 7

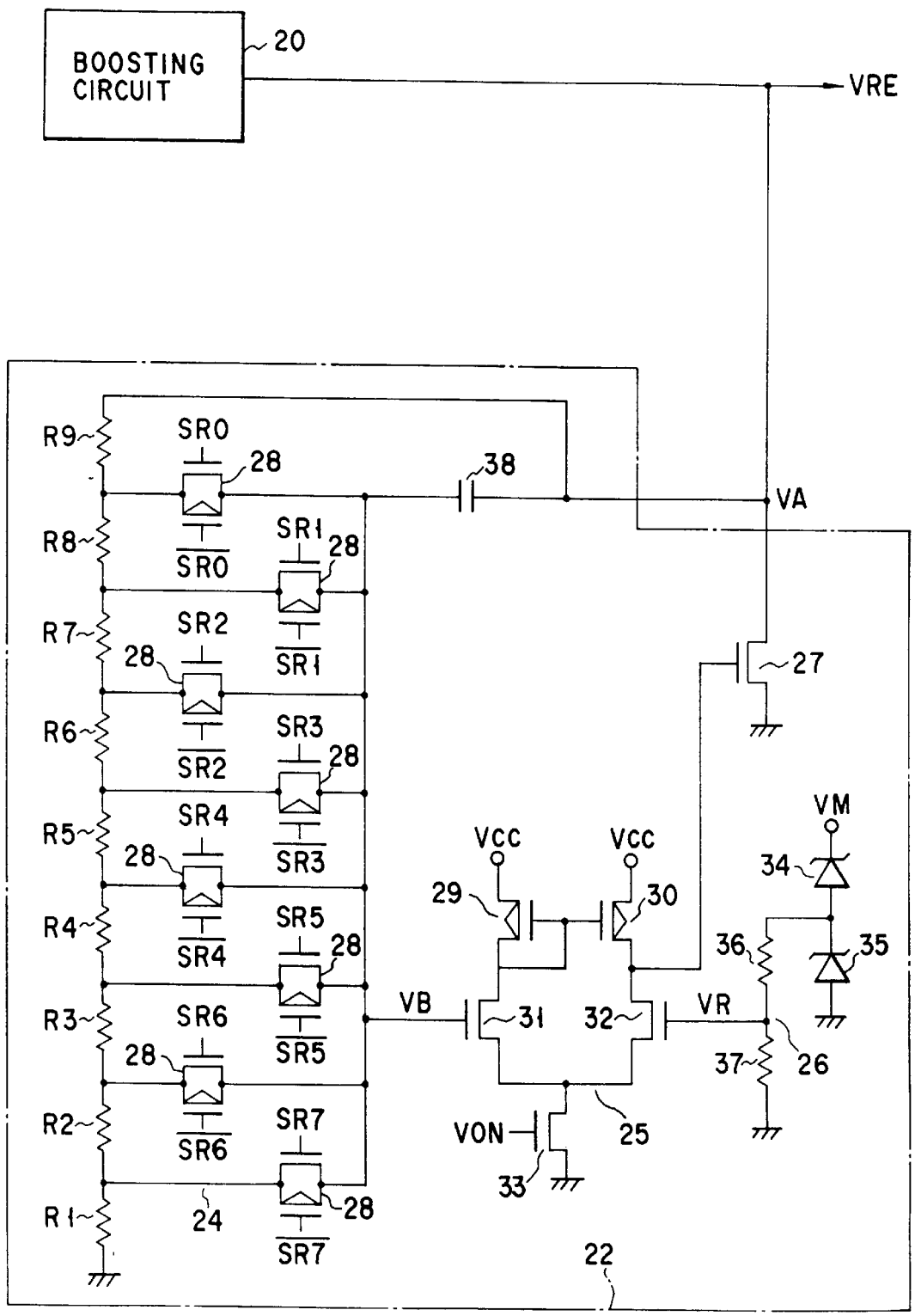
F I G. 9

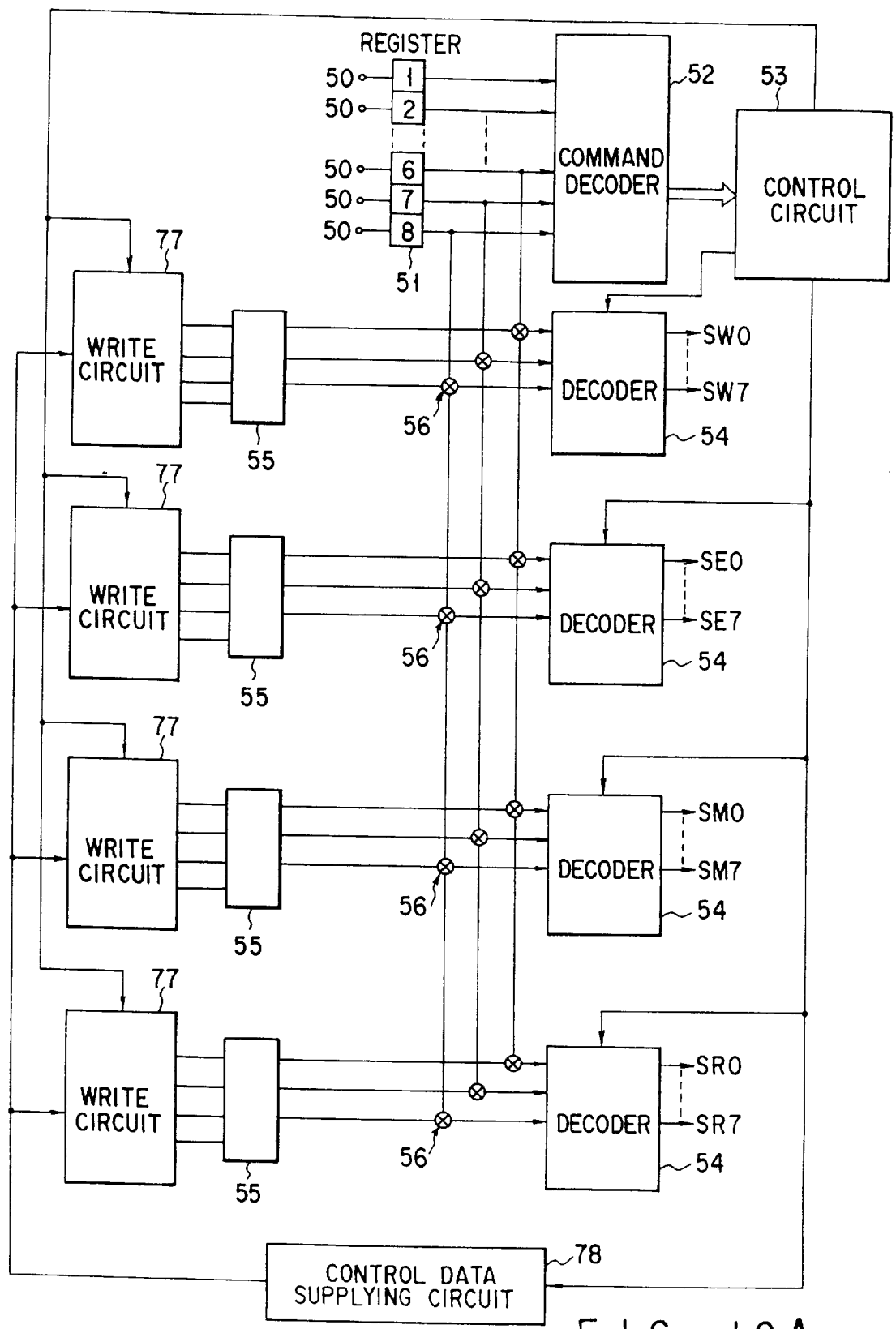
F I G. 10A

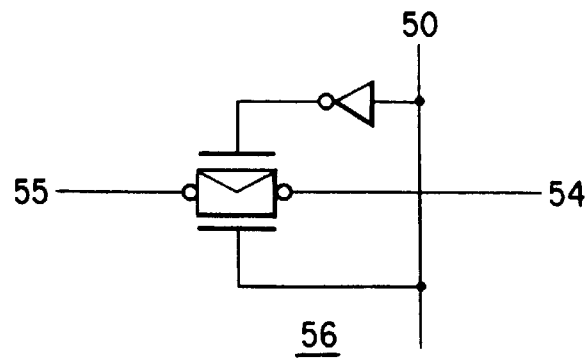
FIG. 10B
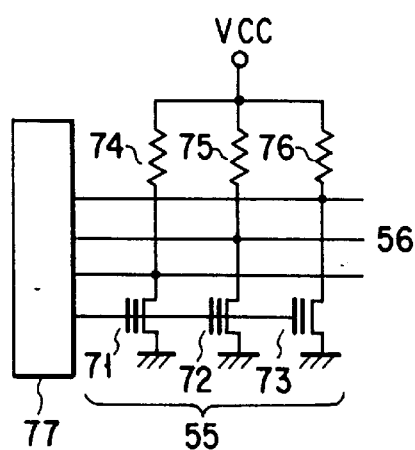
FIG. 10C
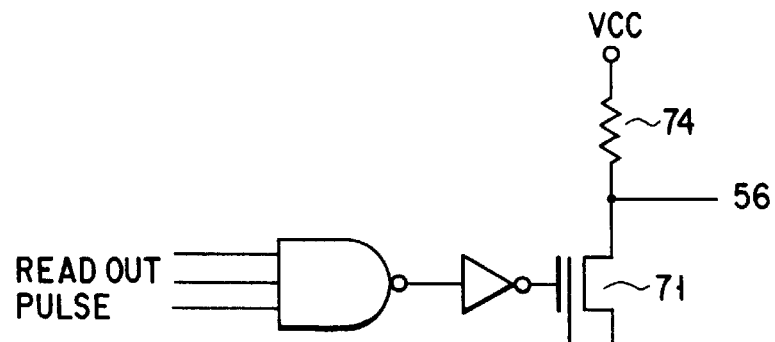
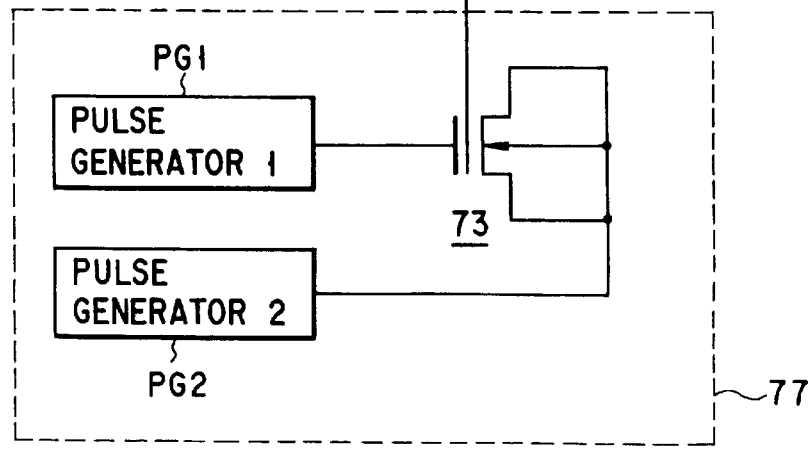
FIG. 10D

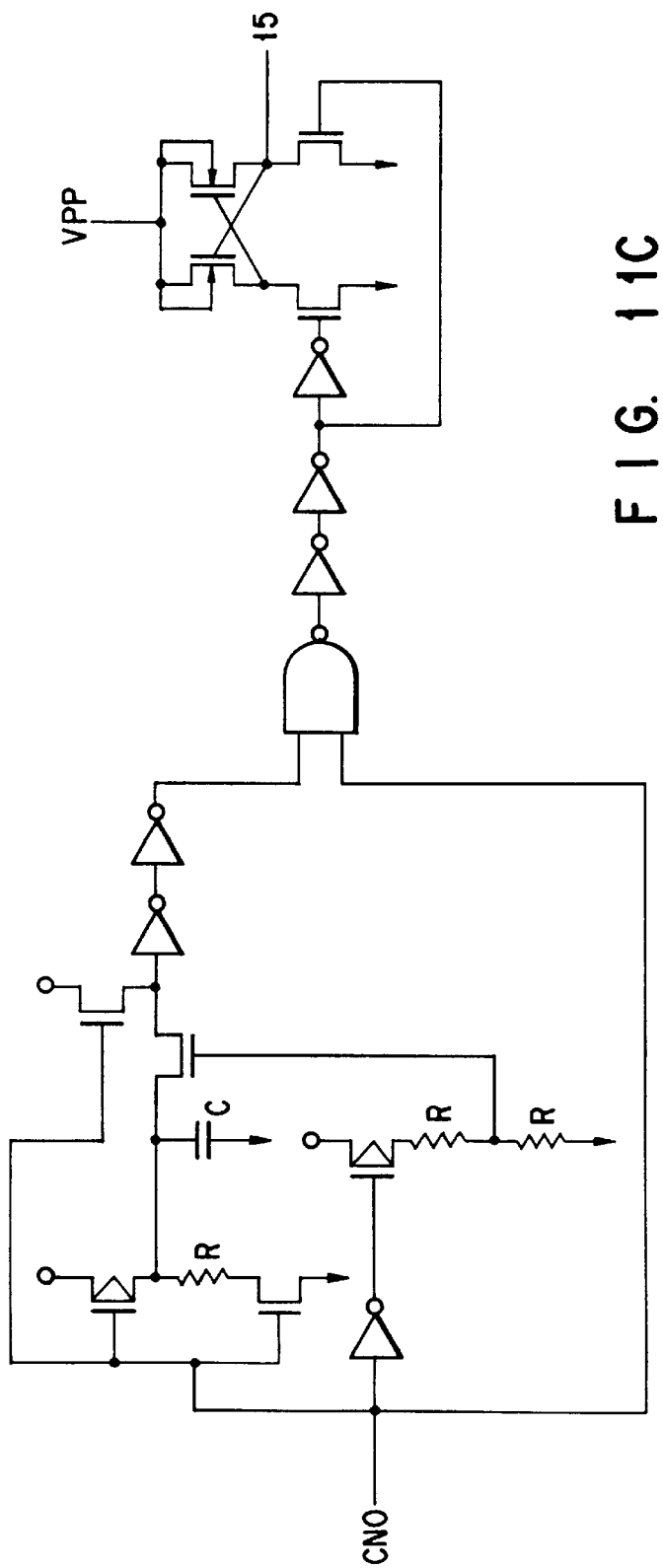
F I G. 11C
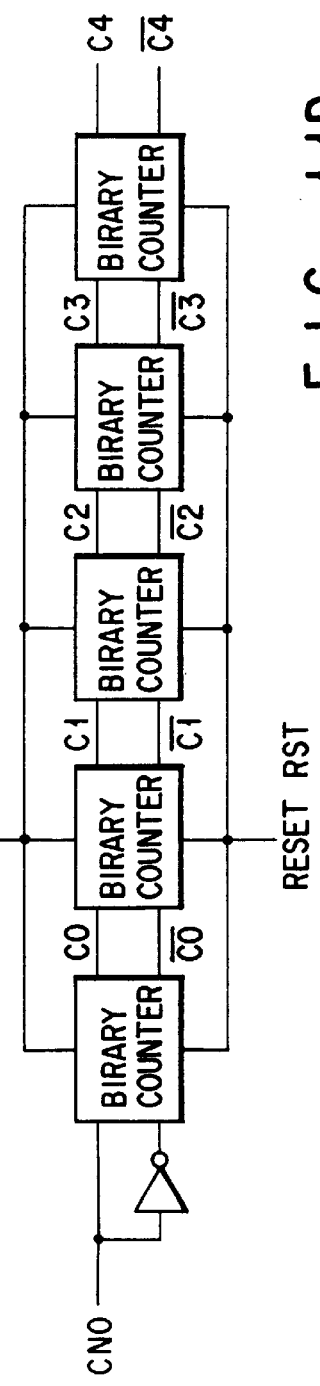
F I G. 11D

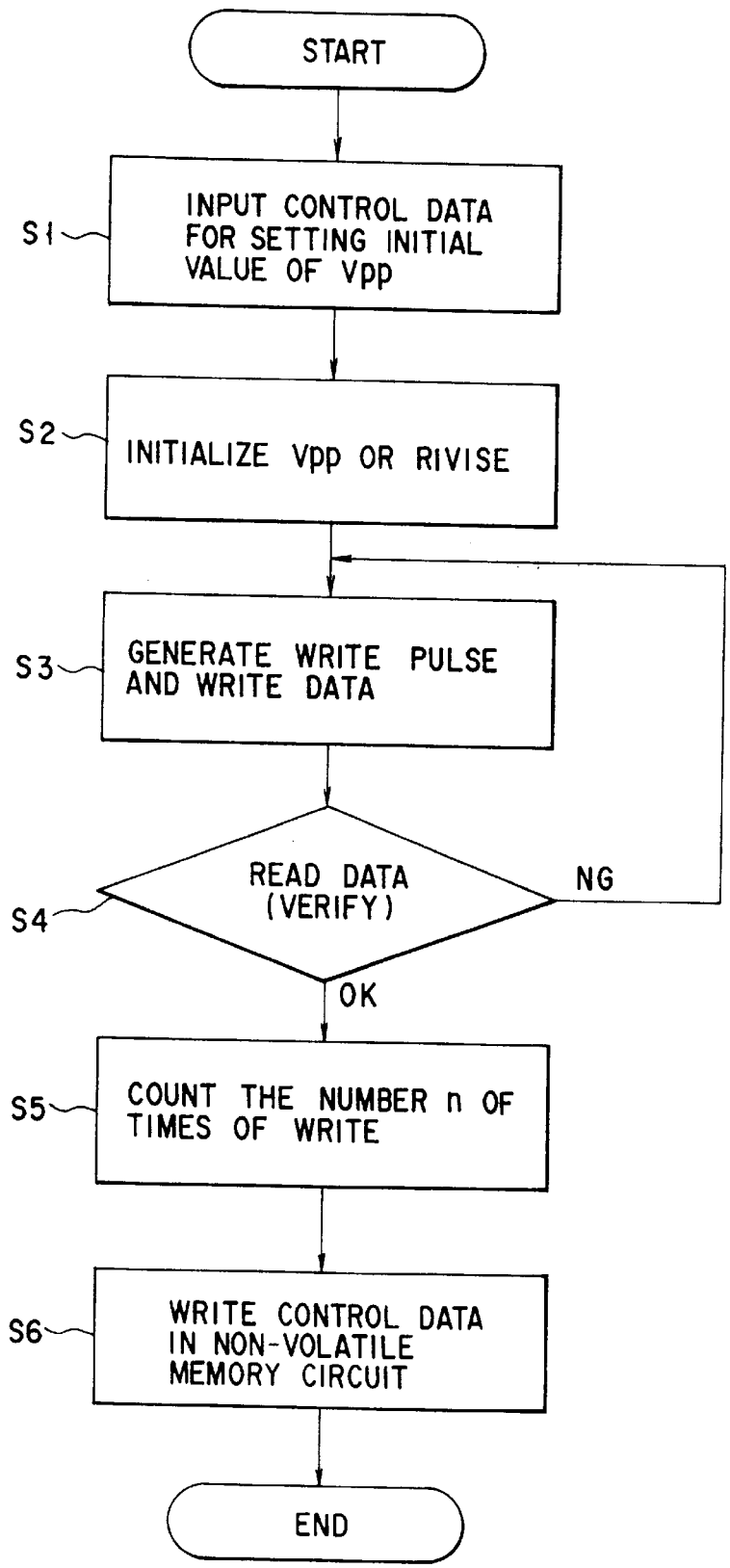
F I G. 12

| CONTROL DATA | | COUNT n OF TIMES OF WRITE | | | | | | |
|---|---|---|---|---|---|---|---|---|
| | | 1~3 | 4 | 5 | 6 | 7 | 8 | 9 OR MORE |
| WRITE VOLTAGE Vpp | 17.5V | ○ | | | | | | |
| | 18V | | ○ | | | | | |
| | 18.5V | | | ○ | ○ | | | |
| | 19V | | | | | ○ | ○ | |
| | 19.5V | | | | | | | ○ |

F I G. 1 3

| CONTROL DATA | | COUNT n OF TIMES OF WRITE | | | | | | |
|---|---|---|---|---|---|---|---|---|
| | | 1 | 2 | 3 | 4 | 5 | 6 | 7~9 |
| WRITE VOLTAGE Vpp | Vppw − ΔVpp | ○ | ○ | ○ | | | | |
| | Vppw | | | | ○ | | | |
| | Vppw + ΔVpp | | | | | ○ | ○ | ○ |
| | Vppw + 2ΔVpp | | | | | | | |
| | Vppw + 3ΔVpp | | | | | | | |

F I G. 1 4

SEMICONDUCTOR MEMORY DEVICE

This application is a Divisional of Ser. No. 08/402,055 filed Mar. 10, 1995, now U.S. Pat. No. 5,784,315.

BACKGROUND OF THE INVENTION

1. Field of the Invention

The present invention relates to a semiconductor memory device in which a memory transistor having a floating gate, serves as a memory cell.

2. Description of the Related Art

Among EEPROMS, the NAND-type EEPROM is known as being capable of a high degree of integration. In the NAND-type EEPROM, the memory transistor constituting one memory cell has a MOSFET structure as shown in FIG. 1, in which, a floating gate 93 and a control gate 94, completely surrounded by an insulation film so as to have no connection with the outside, are laminated onto a substrate 90 in which there are a source 91 and a drain 92. A plurality of such memory cells each having the above-described structure are arranged in a matrix. With regard to the column direction, a plurality of memory cells 95 are connected with each other in series such as to commonly use the sources and drains as shown in FIG. 2. The memory cell located at one end of the series is connected to a bit line BL via a selection gate 96, whereas the one at the other end is connected to a source line S via a selection gate 97. With regard to the row direction, the control gates of a plurality of memory cells are connected in series, thus forming a word line WL.

Next, the read, erase and write operations of data of the NAND-type EEPROM will be described. In the following description, the state in which electrons are present in the floating gate is set as "0", and the threshold voltage of such a state is set within a range of 0.5 to 3.5V. On the other hand, the state in which electrons are not present in the floating gate is set at "1", and the threshold voltage of such a state is set at −1V or less.

Read

A reference voltage of 0V is applied to the control gate of a selected memory cell, whereas a power voltage Vcc (for example, 3.3V) is applied to the control gate of a non-selected memory cell. With this operation, all of the non-selected memory cells are rendered conductive. Selected memory cells are rendered non-conductive when the memory data is "0", and conductive when the memory data is "1". Therefore, data "1" or "0" of a selected memory cell can be read out based on whether or not a current flows through the data line.

Erase

Erase can be defined as extracting electrons from the floating gates of all the memory cells, that is, setting all the memory cells to "1". The erase is carried out on the memory cells all at once. A voltage of 0V is applied to the control gates and the selection gates of all the memory cells. An erase voltage VE (about 20V) is applied to the substrate. With this operation, electrons are discharged to the substrate from the floating gates of all the memory cells due to the tunnel effect.

write

A write voltage VPP (about 20V) is applied to the control gate of a selected memory cell, whereas a middle voltage VM (about 10V) is applied to the control gate of a non-selected memory cell. A voltage of 0V is applied to the bit line of the selected memory cell, whereas a middle voltage VM (about 10V) is applied to the bit line of each of the other memory cells. Thus, a high voltage of 20V is applied between the control gate and the channel of a selected memory cell, and therefore electrons are injected from the channel to the floating gate due to the tunnel effect, thus setting up the state of "0". On the other hand, no tunnel effect occurs between the control gate and the channel of a non-selected memory cell, thus maintaining the state of "1".

The write voltage VPP, the middle voltage VM and the erase voltage VE are obtained by boosting the power voltage Vcc (3.3V) using a high-voltage generating circuit. A conventional high voltage generating circuit consists of a boost circuit 102 including a plurality of charge pump circuits 101 connected to each other in multiple stages, and a voltage limiting circuit 103 connected to the charge pump circuit located at one terminal in the boost circuit 102. A charge pump circuit 101 is constituted so as to control the charge/discharge of a capacitor 106 by two MOSFETs 104 and 105. A plurality of charge pump circuits are connected to each other in such a manner that MOSFETs 105 are connected in series in order to allow common usage of sources and drains thereof. To the capacitor 106 of each charge pump circuit 101, clock signals $\phi 1$ and $\phi 2$ of two phases are supplied from a ring oscillator as shown in FIG. 4.

The voltage limiting circuit 103 consists of the number n (two in FIG. 3) of Zener diodes 107 connected in series. Where the Zener breakdown voltage VZ per one Zener diode is 10V, the voltage limiting circuit 103 limits the write voltage VPP and erase voltage VE to 10V×n.

In a NAND cell-type EEPROM, the time required to write data can be made shorter as the write voltage VPP is higher. Conventionally, this voltage, however, cannot be increased too much and there is a certain upper limit for the voltage for the following reason.

If the write voltage VPP is made too high when writing data, some electrons inevitably flow into the floating gate of the non-selected memory cell connected to the word line, and it is likely that the threshold voltage exceeds 3.5V. As a result, even if a power voltage of 3.3V is applied to the control gate of the non-selected memory cell when writing data, it cannot create a conductive state. In short, the problem in which it is impossible to read data from the selected memory cell, will occur. Such a phenomenon is known as an overwrite.

The overwrite phenomenon occurs due to a variation in the external temperature. When the external temperature varies, the Zener breakdown voltage of the Zener diode 107 increases. Accordingly, the write voltage VPP increases. As a result, the threshold value, in a range of 0.5V to 3.5V for a write time of 10μ sec where the write voltage VPP is, for example, 20V, is raised to be 3.5V or higher for the same write time of 10μ sec when the write voltage VPP increases to 23V.

In order to solve the problem of the overwrite phenomenon, an intelligent write method has been developed. According to this method, a series of operations in which writing of data is carried out at a constant write voltage VPP for a short period of time, and in which the data thus written is read out to be verified, are repeated until appropriate data is written.

In the meantime, the thickness of, for example, the oxide film varies from one product lot to another, one wafer to another and from one chip to another, due to an inevitable processing error. In accordance with such a variation of thickness, the capacity coupling ratio between the oxide film and the interlayer insulation film varies, and therefore the optimal values of the write voltage VPP and the erase voltage VE and the like vary from one product lot to another, one wafer to another and from one chip to another. Therefore, it is conventionally very difficult to optimize the write voltage VPP, the erase voltage VE and the like.

SUMMARY OF THE INVENTION

The object of the present invention is to provided a semiconductor memory device capable of easily optimizing a write voltage and an erase voltage.

According one aspect of the present invention, there is provided a semiconductor memory device comprising:

a bit line;

a word line;

a memory cell, having a floating gate and a control gate, one of a drain and a source thereof being connected to the bit line, and the control gate being connected to the word line, for maintaining data by varying a threshold value;

a boosting circuit for boosting a power voltage up to a write voltage;

a verify circuit, connected to the bit line, for verifying data read from the memory cell via the bit line, outputting a first output signal when the data is incorrect, and outputting a second output signal when the data is correct;

a circuit, connected to an output of the boosting circuit, for applying the write voltage from the boosting circuit to the word line upon reception of the first output signal from the verify circuit to write the data in the memory cell;

a count circuit, connected to an output terminal of the verify circuit, for counting the number of times of write by inputting the first output signal, and outputting data of the number of times of write by inputting the second output signal from the verify circuit;

a data table, connected to an output of the counter, for storing various correlations between the numbers of times of write and write voltages and outputting write voltage data corresponding to data of the number of times of write;

a memory element, connected to an output of the data table, for storing the write voltage data;

a write circuit for writing the write voltage data in the memory element;

a voltage limiting circuit, one terminal of which is connected to an output of the boosting circuit, for varying the write voltage in accordance with a voltage at the other terminal of the voltage limiting circuit;

a voltage dividing circuit, connected to the other end of the voltage limiting circuit, for dividing the voltage at the other end of the voltage limiting circuit into several voltages; and a control circuit for decoding the write voltage data of the memory element in a write mode, and controlling the voltage dividing circuit so as to set the write voltage at a voltage indicated by the write voltage data.

According to another aspect of the present invention, there is provided a semiconductor memory device comprising:

a bit line;

a word line;

a memory cell, having a floating gate and a control gate laminated on a substrate, one of a drain and a source thereof being connected to the bit line, and the control gate being connected to the word line, for maintaining data by varying a threshold value;

a boosting circuit for boosting a power voltage up to an erase voltage;

a verify circuit, connected to the bit line, for verifying data read from the memory cell via the bit line, and outputting a first output signal when the data is incorrect, and outputting a second output signal when the data is correct;

a circuit, connected to an output of the boosting circuit, for applying the erase voltage from the boosting circuit to the substrate upon reception of the first output signal from the verify circuit, to erase the data from the memory cell;

a count circuit, connected to an output terminal of the verify circuit, for counting the number of times of erase by inputting the first output signal, and outputting data of the number of times of erase by inputting the second output signal from the verify circuit;

a data table, connected to an output of the counter, for storing various correlations between the numbers of times of erase and erase voltages and outputting erase voltage data corresponding to data of the number of times of erase;

a memory element, connected to an output of the data table, for storing the erase voltage data;

a write circuit for writing the erase voltage data in the memory element;

a voltage limiting circuit, one terminal of which is connected to an output of the boosting circuit, for varying the erase voltage in accordance with a voltage at the other terminal of the voltage limiting circuit;

a voltage dividing circuit, connected to the other end of the voltage limiting circuit, for dividing the voltage at the other end of the voltage limiting circuit into several voltages; and a control circuit for decoding the erase voltage data of the memory element in an erase mode, and controlling the voltage dividing circuit so as to set the erase voltage at a voltage indicated by the erase voltage data.

According to another aspect of the present invention, there is provided a semiconductor memory device comprising:

an NAND-type memory cell array in which a plurality of memory cells each having a floating gate and a control gate are connected in series such as to share drains and sources thereof;

a bit line connected to a memory cell at one end of the NAND-type memory cell array, via a control gate;

a plurality of word lines connected respectively to control gates of the plurality of memory cells;

a boosting circuit for boosting a power voltage up to a write voltage;

a verify circuit, connected to the bit line, for verifying data read from the plurality of memory cells via the bit line, outputting a first output signal when the data is incorrect, and outputting a second output signal when the data is correct;

a circuit, connected to an output of the boosting circuit, for applying the write voltage from the boosting circuit to a selected one of the word lines upon reception of the first output signal from the verify circuit, so as to write the data in the memory cell;

a count circuit, connected to an output terminal of the verify circuit, for counting the number of times of write by inputting the first output signal, and outputting data of the number of times of write by inputting the second output signal from the verify circuit;

a data table, connected to an output of the counter, for storing various correlations between the numbers of times of write and write voltages and outputting write voltage data corresponding to data of the number of times of write;

a memory element, connected to an output of the data table, for storing the write voltage data;

a write circuit for writing the write voltage data in the memory element;

a voltage limiting circuit, one terminal of which is connected to an output of the boosting circuit, for varying the write voltage in accordance with a voltage at the other terminal of the voltage limiting circuit;

a voltage dividing circuit, connected to the other end of the voltage limiting circuit, for dividing the voltage at the other end of the voltage limiting circuit into several voltages; and a control circuit for decoding the write voltage data of the memory element in a write mode, and controlling the voltage dividing circuit so as to set the write voltage at a voltage indicated by the write voltage data.

According to another aspect of the present invention, there is provided a semiconductor memory device comprising:

an NAND-type memory cell array in which a plurality of memory cells each having a floating gate and a control gate are connected in series such as to share drains and sources thereof;

a bit line connected to a memory cell at one end of the NAND-type memory cell array, via a control gate;

a plurality of word lines connected respectively to control gates of the plurality of memory cells;

a boosting circuit for boosting a power voltage up to an erase voltage;

a verify circuit, connected to the bit line, for verifying data read from the plurality of memory cells via the bit line, and outputting a first output signal when the data is incorrect and outputting a second output signal when the data is correct;

a circuit, connected to an output of the boosting circuit, for applying the erase voltage from the boosting circuit to a selected one of the word lines boosting circuit to a selected one of the word lines upon reception of the first output signal from the verify circuit, so as to erase the data in the memory cell;

a count circuit, connected to an output terminal of the verify circuit, for counting the number of times of erase by inputting the first output signal, and outputting data of the number of times of erase by inputting the second output signal from the verify circuit;

a data table, connected to an output of the counter, for storing various correlations between the numbers of times of erase and erase voltages and outputting erase voltage data corresponding to data of the number of times of erase;

a memory element, connected to an output of the data table, for storing the erase voltage data;

a write circuit for writing the erase voltage data in the memory element;

a voltage limiting circuit, one terminal of which is connected to an output of the boosting circuit, for varying the erase voltage in accordance with a voltage at the other terminal of the voltage limiting circuit;

a voltage dividing circuit, connected to the other end of the voltage limiting circuit, for dividing the voltage at the other end of the voltage limiting circuit into several voltages; and a control circuit for decoding the erase voltage data of the memory element in an erase mode, and controlling the voltage dividing circuit so as to set the erase voltage at a voltage indicated by the erase voltage data.

According to another aspect of the present invention, there is provided a semiconductor memory device comprising:

a plurality of memory cells arranged in matrix, the cells in a same column being connected to a bit line;

a verify circuit connected to the bit line for detecting whether a write operation is completed and for generating a verify signal;

a counter circuit for receiving the verify signal, for counting a number of cycles the write operation runs, and for generating a number signal;

a data table for receiving the number signal, and for generating a control signal which corresponds to the number signal according to correlation stored in the data table;

a high voltage generation circuit for receiving the control signal and for generating a write voltage applied to the cells during the writing operation, which is varied on the basis of the control signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a schematic diagram showing a cross section of a memory transistor having a floating gate;

FIG. 2 is a circuit diagram equivalent to a NAND-type EEPROM;

FIG. 3 is a circuit diagram showing a conventional high voltage generating circuit;

FIGS. 4A and 4B are waveform diagram of clock signals of two phases, supplied to the high voltage generating circuit shown in FIG. 3;

FIGS. 5A to 5H are diagrams showing a part of the structure of a NAND-type EEPROM according to an embodiment of the present invention;

FIG. 7 is a circuit diagram showing voltage limiting circuits and voltage setting portions, used for generating an erase voltage, shown in FIG. 5;

FIG. 9 is a circuit diagram showing voltage limiting circuits and voltage setting portions, used for generating an erase voltage, shown in FIG. 5;

FIGS. 10A to 10D are circuit diagrams showing signal generating circuits for generating control signals SW0–SW7, SE0–SE7, SM0–SM7 and SR0–SR7, for controlling the voltage limiting circuits shown in FIG. 5;

FIGS. 11A to 11J are block diagrams each showing a control circuit for setting an optimal value of a write voltage and for storing control data thereof;

FIG. 12 is a flowchart of the operation for setting a write voltage by the control circuit shown in FIG. 11;

FIG. 13 is a table showing a correlation between the number n of a write of data stored in the data table shown in FIG. 11 and set values of the write voltage VPP; and FIG. 14 is another table showing a correlation between the number n of a write of data stored in the data table shown in FIG. 11 and set values of the write voltage VPP.

DETAILED DESCRIPTION OF THE PREFERRED EMBODIMENT

Figure 5B:
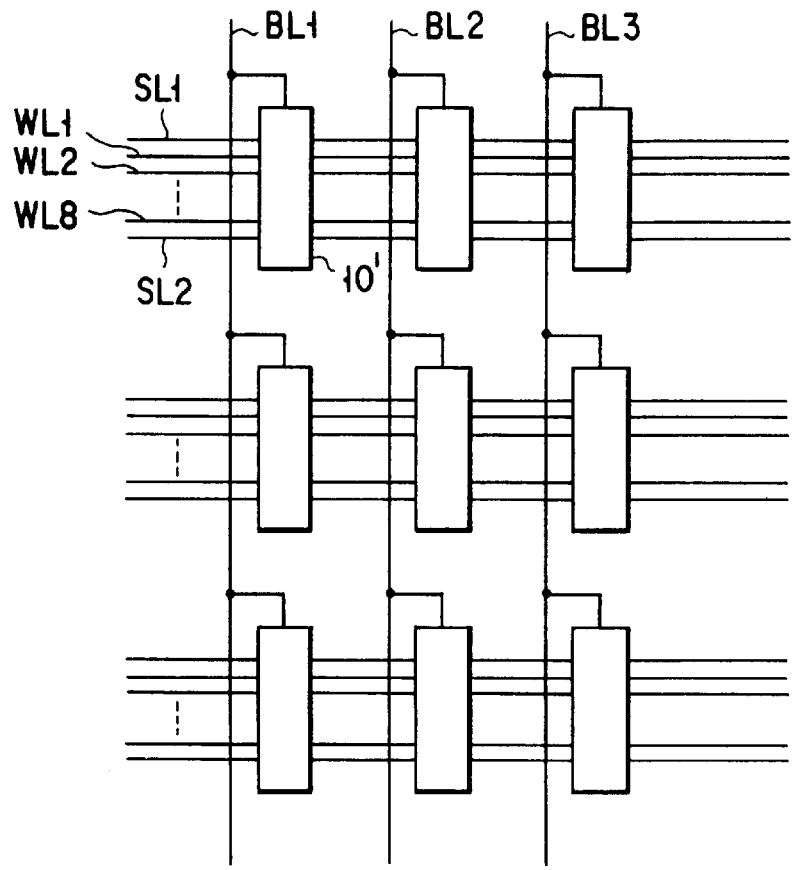
Figure 5C:
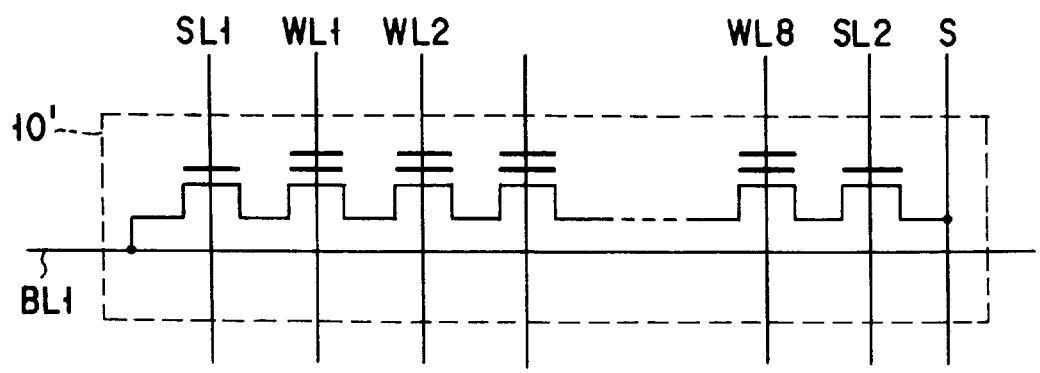
Figure 5D:
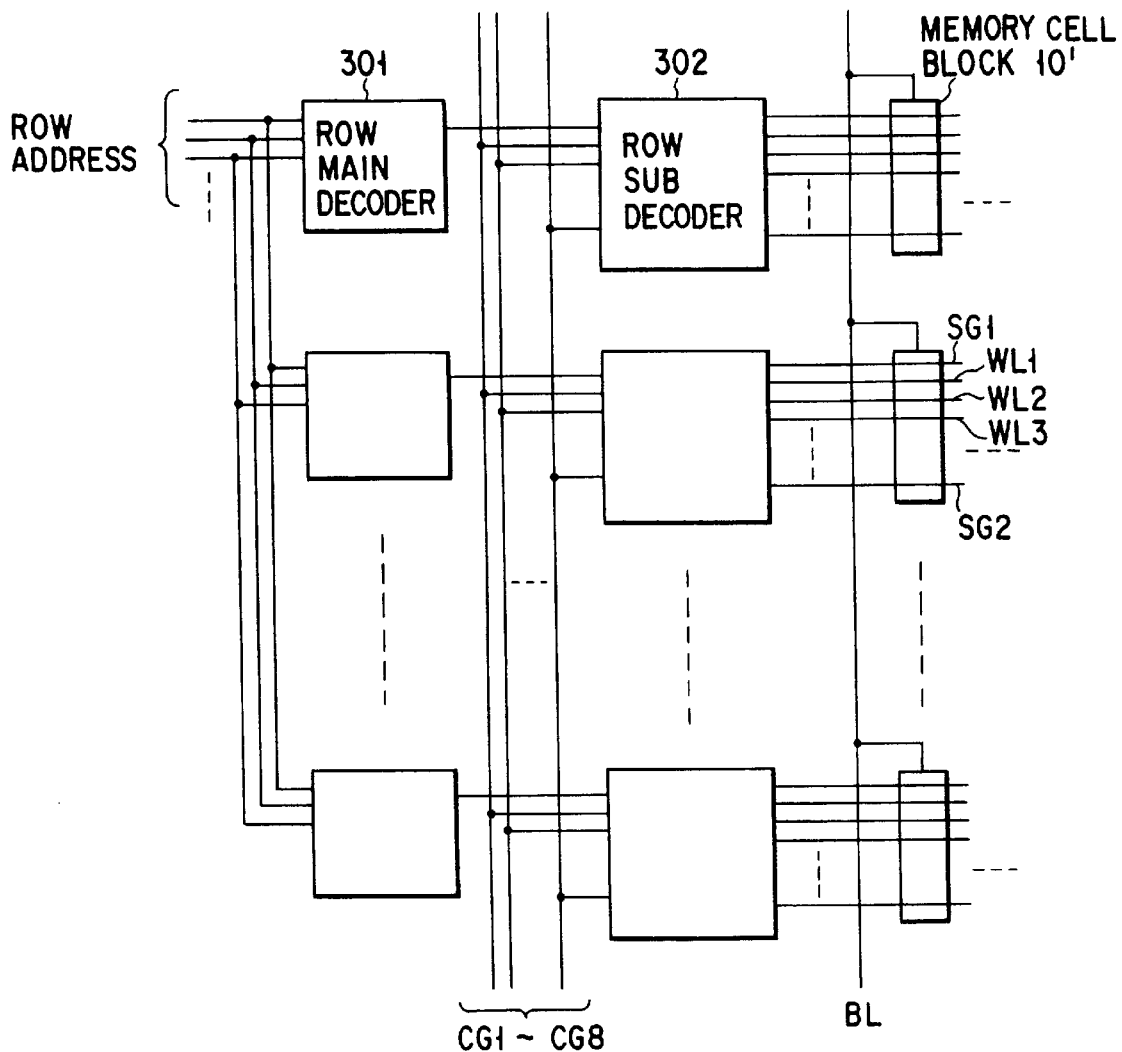
Figure 5E:
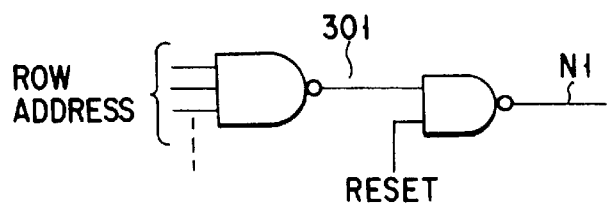
Figure 5F:
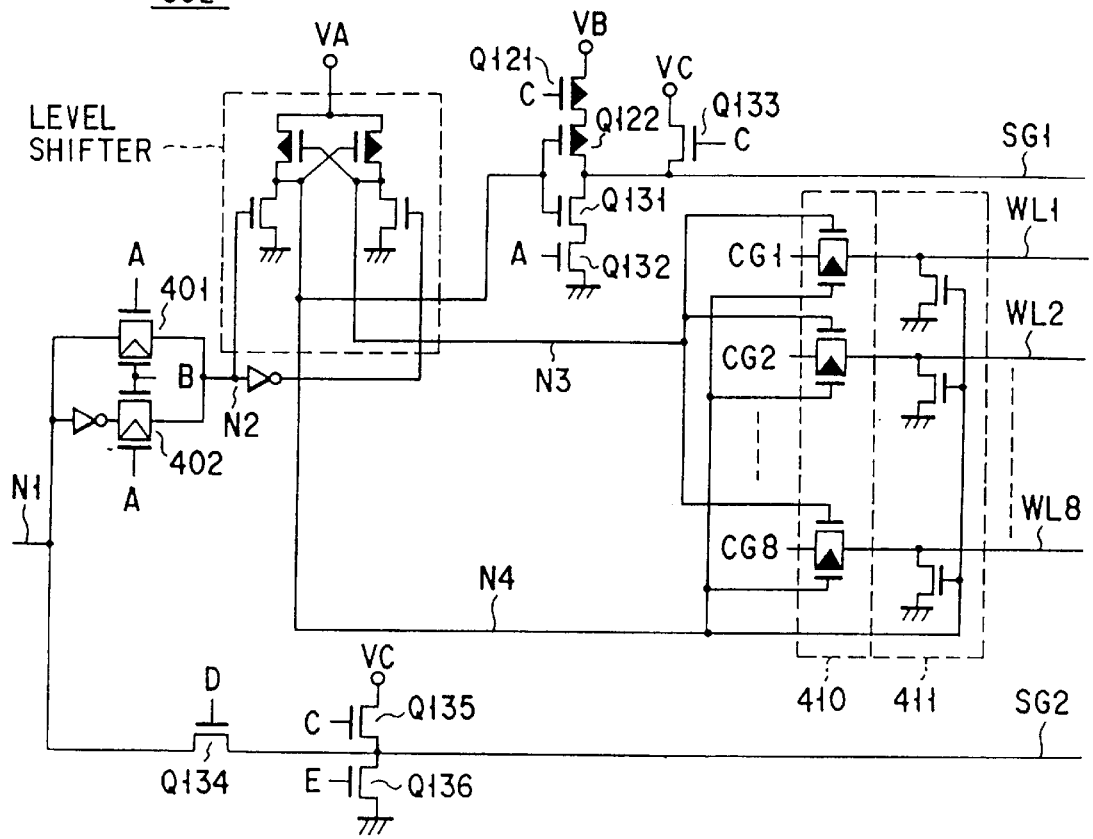

Embodiments of the semiconductor memory device according to the present invention will now be described with reference to drawings.

FIGS. 5A to 5H are diagrams showing the structure of a NAND-type EEPROM according to an embodiment of the present invention. A memory cell 11 is an N-channel MOSFET (memory transistor) having a floating gate and a control gate as shown in FIG. 1. A memory cell array 10 consists of a plurality of memory cells 11 arranged in matrix. Those of the memory cells 11 which are arranged in the column direction are connected in series. A word line WL connects the control gates of those of the memory cells 11 arranged in the row direction with each other. Terminals of the memory cells connected in series in the row direction are connected to a bit line BL via selection gates 12, and other terminals are connected to a source line S via selection gates 12.

An address decode circuit 13 consists of a decoder 14 for decoding an input address signal and a word line driver 15 for supplying a predetermined voltage to the word line WL in accordance with an output from the decoder 14. In order to write, erase or read data, a word line WL is selectively driven on the basis of an address signal.

In addition to a power voltage of 3.3V and a reference voltage of 0V, for example, the following voltages are supplied to the word line driver 15: a write voltage VPP of, for example, 20V, applied from the high voltage generating circuit 17 to the control gate of a memory cell 11 selected for a write, a middle voltage VM of, for example, 10V, applied from the high voltage generating circuit 18 to the control gate of a memory cell 11 not selected for a write, an erase voltage VE of, for example, 22V, applied from the high voltage generating circuit 17a to the substrate for an erase, and a read voltage VRE, which is an intermediate potential of, for example 4V, applied from the high voltage generating circuit 18a to the control gate of a memory cell not selected for a read. To the bit line driver 16, a middle voltage VM of, for example, 10V, applied from the high voltage generating circuit 18 to the control gate of a memory cell 11 not selected for a write, is supplied.

The high voltage generating circuits 17, 17a, 18 and 18a have similar structures. Therefore, the structure of only the high voltage generating circuit 17 for generating a write voltage VPP will be described as a typical example. The high voltage generating circuit 17 for generating a write voltage VPP includes a ring oscillator 19, a boosting circuit 20, a voltage limiting circuit 21 and a voltage setting circuit 22.

The boosting circuit 20 serves to boost the power voltage Vcc to obtain a high voltage of, for example, 20V, and includes charge pump circuits connected in multiple stages as shown in, for example, FIG. 3. The ring oscillator 19 generates clock signals φ1 and φ2 of two phases as shown in FIG. 4, used in the boosting circuit 20.

The voltage limiting circuit 21 connected to the output terminal of the boosting circuit 20 by one end, serves to limit the output voltage of the boosting circuit 20 at a constant value to obtain a write voltage VPP. The voltage setting circuit 22 is connected to the other terminal of the voltage limiting circuit 21, to be able to vary the voltage at the other terminal of the voltage limiting circuit 21. The output voltage of the booster circuit 20, that is, the write voltage VPP, can be freely changed by the voltage setting circuit 22.

Figure 6:
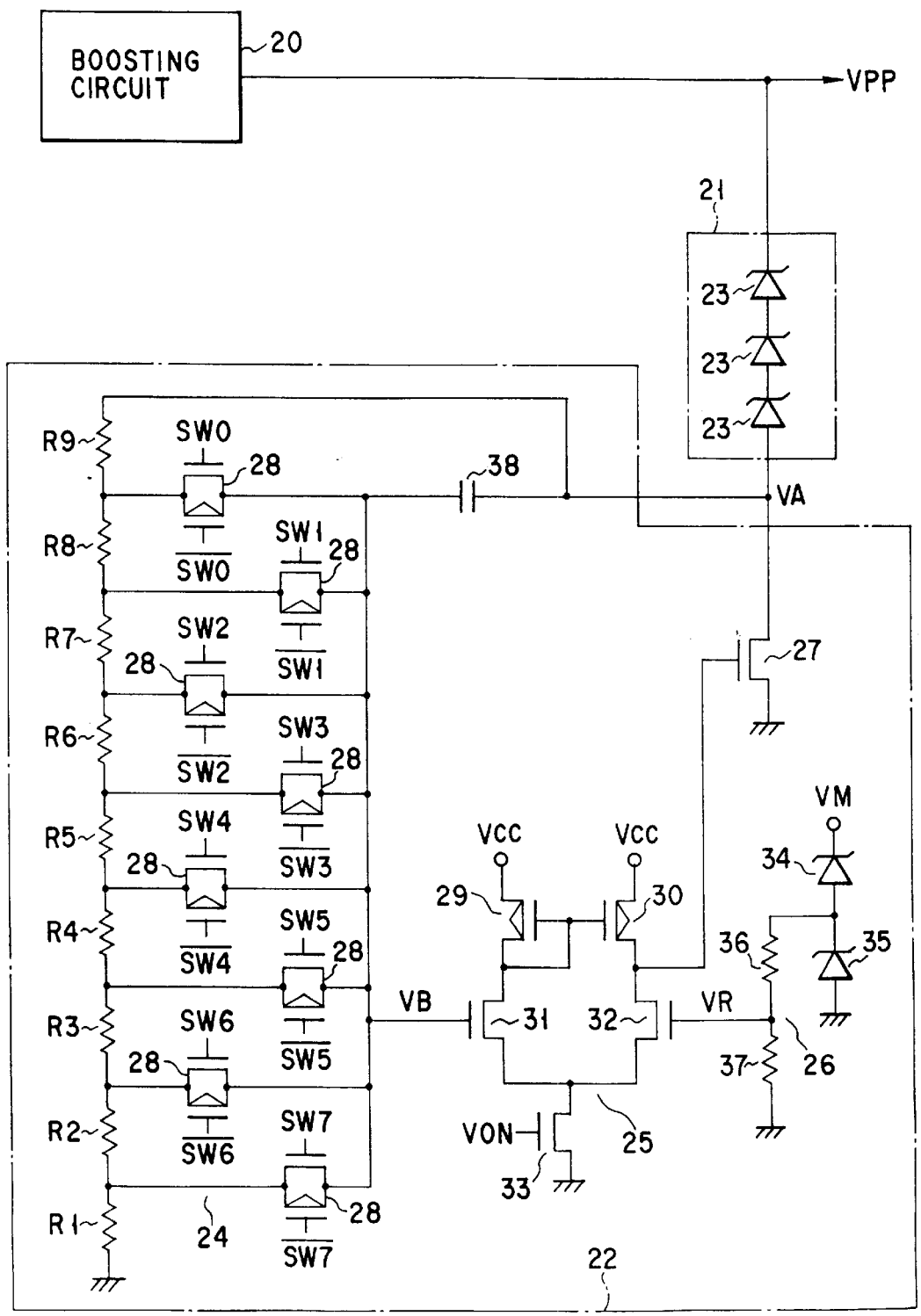
FIG. 6 is a circuit diagram showing voltage limiting circuits and voltage setting portions, used for generating a write voltage, shown in FIG. 5.

FIG. 6 is a circuit diagram showing the structures of the voltage limiting circuit 21 and the voltage setting circuit 22 in the high-voltage generating circuit 17. The voltage limiting circuit 21 consists of the number n of, in this case, three, Zener diodes connected in series to be opposite to the boosting circuit 20. The Zener breakdown voltage VZ of each Zener diode 23 is set close to, for example, 5V, where no substantial temperature characteristic is exhibited. The value of VZ should preferably be set within a range of 4 to 7V. The Zener breakdown voltage obtained in the voltage limiting circuit 21 is n×5V, which is 15V.

The voltage setting circuit 22 includes a voltage generating circuit 24, a voltage comparing circuit 25, a reference voltage generating circuit 26 and an N-channel MOSFET 27 for lowering the voltage. The voltage generating circuit 24 consists of a plurality of, in this case, nine, resistances R1–R9 for dividing voltage, and eight CMOS transfer gates 28. The resistance R1–R9 are connected in series between the voltage limiting circuit 21 and the ground. The eight CMOS transfer gates 28 are respectively connected to intermediate terminals of the resistances R1–R9. To the gates of the eight CMOS transfer gates, pairs of SW0 and /SW0, SW1 and /SW2, . . . SW7 and /SW7, which are complementary to each other, are supplied. Note that symbol/indicates an inversion. The control circuit for supplying these control signals will be described later.

In the voltage setting circuit 22, a potential difference between a voltage VA at the other terminal of the voltage limiting circuit 21 and a reference voltage 0V is divided into 8 components by the nine resistances R9–R1. Either one of the eight component voltages divided is selected as one of the transfer gates 28 is made conductive by a control signal.

The voltage comparing circuit 25 is a differential type operation amplifying circuit. A voltage VB selected in the voltage generating circuit 24 is supplied to the gate of the MOSFET 31. A reference voltage VR generated in the reference voltage generating circuit 26 is supplied to the gate of the MOSFET 32. The voltage comparing circuit 25 compares VB and VR with each other. A control signal VON is supplied to the gate of the MOSFET 33 in the voltage comparing circuit 25. When the signal VON is set at a level "1" (3.3V) and the MOSFET 33 is made conductive, the comparing operation of the voltage comparing circuit 25 is carried out. The logical level of the signal VON is set based on a control signal R/W for writing/reading data in the EEPROM.

The reference voltage generating circuit 26 stably generates a reference voltage VR as a middle voltage VM supplied from the high voltage generating circuit 18 is divided into two by the two Zener diodes 34 and 35 connected in series, and these two divided voltages are divided by the two resistances 36 and 37 based on the resistance ratio therebetween.

The drain of the MOSFET 27 for lowering a voltage is connected to the other terminal of the voltage limiting circuit 21, and the source is grounded. To the gate of the MOSFET 27, an output voltage of the voltage comparing circuit 25 is supplied. The gate of the MOSFET 27 is controlled in accordance with the output of the voltage comparing circuit 25, and therefore the conductive resistance between the drain and source varies. Accordingly, the value for the voltage drop between the drain and source varies along with the conductive resistance. Consequently, the voltage VA at the other terminal of the voltage limiting circuit 21 varies. Thus, the output voltage of the boosting circuit 20, that is, the write voltage VPP, varies.

A capacitor 38 is inserted between the other terminal of the voltage limiting circuit 21 and the gate of the MOSFET 41 in the voltage comparing circuit 25, and serves to prevent oscillation.

Next, the operation of the high voltage generating circuit 17 for generating a write voltage VPP will be described with reference to the circuit shown in FIGS. 5 and 6.

When the power is turned on, the ring oscillator 19 starts the oscillation. Accordingly, clock signals $\phi 1$ and $\phi 2$ are supplied to the boosting circuit 20, and the boosting of the power voltage Vcc is started. When the output voltage of the boosting circuit 20 is made sufficiently high, the voltage is limited by the voltage limiting circuit 21 to the sum of the voltage multiplied by n (n is the number of Zener diodes) of the Zener breakdown voltage, in this case, 5V×3=15V, and the voltage VA at the other end of the voltage limiting circuit 21, which is (15V+VA).

Supposing that the control signals SW3 and /SW3 are set to a level "1" (3.3V) and a level "0" (0V), only those of the transfer gates 28 which correspond to signals SW3 and /SW3 are made conductive in the voltage generating circuit 24, whereas the other CMOS transfer gates are made all non-conductive. In this case, the output voltage VB of the voltage generating circuit 24 is expressed by formula (1).

$$VB=\{(R1+R2+R3+R4+R5)/(R1+R2+\ldots+R8+R9)\}\cdot VR \quad (1)$$

Further, due to the general effect of the operation amplifier circuit, the input voltages VB and VR of the voltage comparing circuit 25 are made equal, and therefore, where R1+R2+R3+R4+R5=RA and R6+R7+R8+R9=RB, VA can be expressed by the following formula (2):

$$VA=(1+RB/RA)\phi VR \quad (2)$$

According to the formula (2), the voltage VA can be varied by varying the value (RB/RA). Therefore, the value of the write voltage VPP can be freely varied. Further, the value of (RB/RA) is determined by which one of the eight transfer gates 28 in the voltage generating circuit 24 is made conductive. The conduction states of the transfer gates 28 are controlled in accordance with the setting of the logical levels of the control signals SW0 and /SW0 to SW7 and /SW7.

Supposing that the reference voltage VR is set to, for example, 2.5V, and the value of (RB/RA) is set to 1, the value of VA is 5V as calculated from the formula (2). Therefore, VPP=15V+VA=15V+5V=20V.

The voltage limit set in the voltage limiting circuit 21 is determined by the three Zener diodes 23 which do not have substantial temperature properties, and therefore the Zener breakdown voltage in the voltage limiting circuit 21, which is 15V in this case, does not substantially change even if the temperature varies. Further, the voltage at the other terminal of the voltage limiting circuit 21 is generated on the basis of the reference voltage VR which is not substantially temperature-dependent. Accordingly, the voltage hardly varies even if the temperature varies. Therefore, the value of the write voltage VPP does not substantially vary, but can be freely changed in a certain range.

FIG. 7 is a circuit diagram showing the structures of the voltage limiting circuit 21 and the voltage setting circuit 22 in the high voltage generating circuit 17a for generating an erase voltage VE, shown in FIG. 5. The values of the resistances R9–R1 for dividing a voltage and the resistances 36 and 37 for generating a reference voltage VR are set such that the output voltage of the boosting circuit 20 (i.e. erase voltage VE) can be varied within a predetermined range around 22V. Similar to the case of the write voltage VPP, the output voltage of the boosting circuit 20 (erase voltage VE) can be arbitrarily varied. Such a variation can be created as an arbitrary one of the eight CMOS transfer gates 28 in the voltage generating circuit 24 is made conductive by setting different logical levels of the control signals SE0 and /SE0 to SE7 and /SE7.

Figure 8:
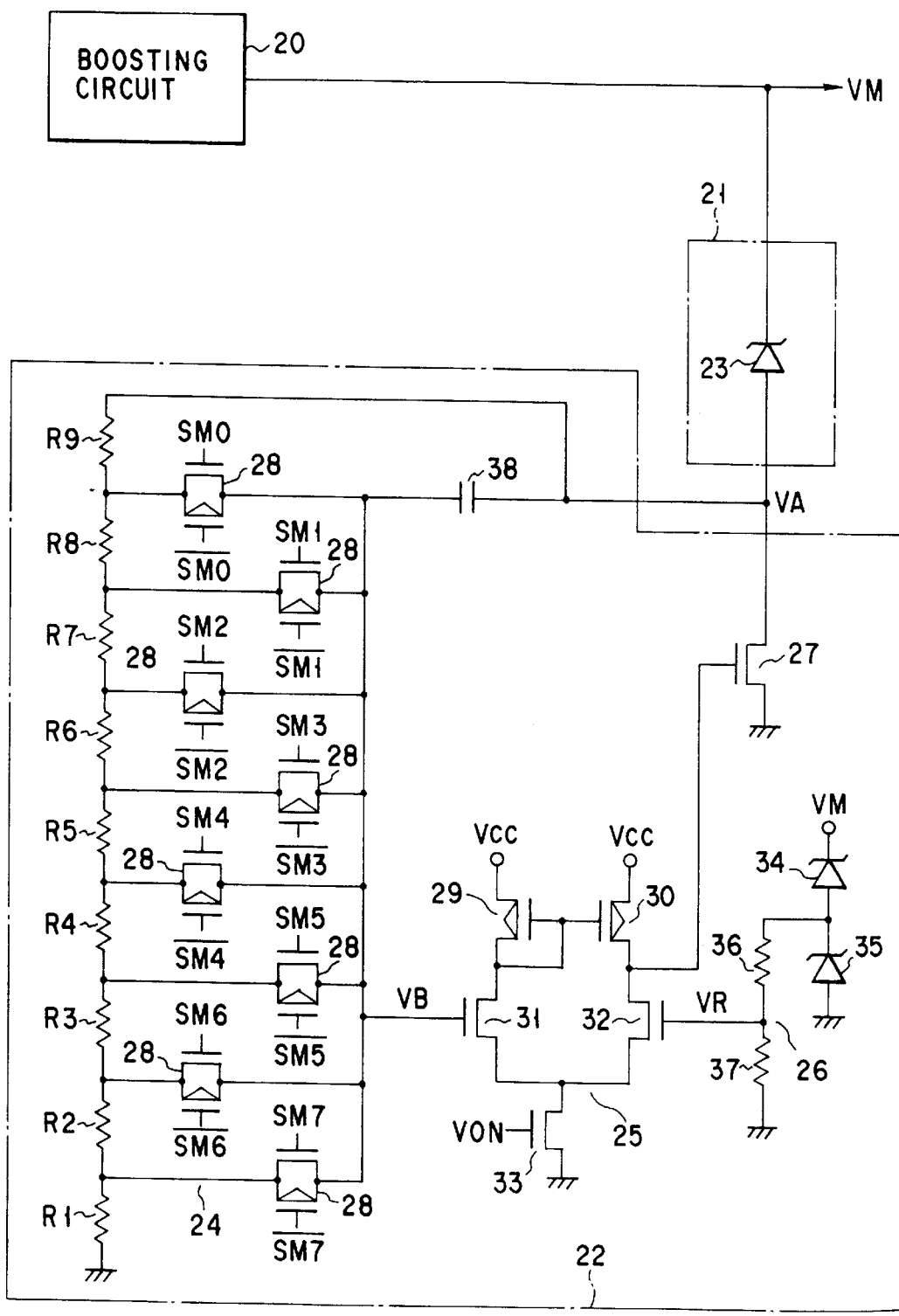
FIG. 8 is a circuit diagram showing voltage limiting circuits and voltage setting portions, used for generating a middle voltage, shown in FIG. 5.

FIG. 8 is a circuit diagram showing the structures of the voltage limiting circuit 21 and the voltage setting circuit 22 in the high voltage generating circuit 18 for generating a middle voltage VM, shown in FIG. 5. The voltage limiting circuit 21 includes one Zener diode 23. The values of the resistances R9–R1 for dividing a voltage and the resistances 36 and 37 for generating a reference voltage VR are set such that the output voltage of the boosting circuit 20 can be varied within a predetermined range around 10V. Similar to the case of the write voltage VPP, the output voltage of the boosting circuit 20 can be arbitrarily varied. Such a variation can be created as an arbitrary one of the eight CMOS transfer gates 28 in the voltage generating circuit 24 is made conductive by setting different logical levels of the control signals SE0 and /SE0 to SE7 and /SE7.

FIG. 9 is a circuit diagram showing the structure of the voltage setting circuit 22 in the high voltage generating circuit 18a for generating a read voltage VRE, shown in FIG. 5. In this circuit 18a, no voltage limiting circuit 21 is present. The drain of the MOSFET 27 for lowering voltage is directly connected to the output terminal of the boosting circuit 20. The values of the resistances R9–R1 for dividing a voltage and the resistances 36 and 37 for generating a reference voltage VR are set such that the output voltage of the boosting circuit 20 can be varied within a predetermined range around 4V. Similar to the case of the write voltage VPP, the output voltage of the boosting circuit 20 can be arbitrarily varied. Such a variation can be created as an arbitrary one of the eight CMOS transfer gates 28 in the voltage generating circuit 24 is made conductive by setting different logical levels of the control signals SE0 and /SE0 to SE7 and /SE7.

Note that it is also possible that there is only one ring oscillator 19 used commonly to the four high voltage generating circuits 17, 17a, 18 and 18a shown in FIG. 5. Further, in the above embodiment, a separate reference voltage VR is provided for each one of the voltages VPP, VE and VRE to be generated; however one reference voltage generating circuit 26 may be shared with the voltages VPP, VE and VRE. In place of the eight CMOS transfer gates 28 shown in FIGS. 6–9, a transfer gate consisting solely of an NMOS transistor or a PMOS transistor may be used. In this case, it is necessary to apply a voltage different from the power voltage Vcc to the gate so as to prevent the transfer voltage drop caused by the threshold voltage of the NMOS or PMOS transistor.

The write, erase and read of data for the NAND-type EEPROM shown in FIG. 5 will now be described.

Erase

The erase of data is carried out on all the memory cells all at once. More specifically, a voltage of 0V is applied to all the control gates and all the selection gates, and a boosted erase voltage VE is applied to the p-type well and the n-type substrate (not shown). With this operation, the electrons of the floating gate are discharged to the substrate in all the memory cells. Therefore, the threshold voltage is shifted to the negative direction. Note that the following description is based on the case where the state in which electrons are not present in the floating gate is set as "1", and the threshold voltage of such a state is set at –1V or less.

Write

A write voltage VPP is applied to the control gate of a selected memory cell, whereas a middle voltage VM is applied to the control gate of a non-selected memory cell. A voltage of 0V is applied to the bit line of the selected memory cell, whereas a middle voltage VM (about 10V) is applied to the bit line of each of the other memory cells. Thus, a high voltage of 20V is applied between the control gate and the channel of a selected memory cell, and therefore electrons are injected from the channel to the floating gate due to the tunnel effect. Consequently, the threshold voltage is shifted to the positive direction, thus shifting from a threshold voltage of –1V or less, which indicates the state "1" to a range of 0.5V–3.5V, which indicates the state of "0". No electrons are injected into the floating gate of a non-selected memory cell, thus maintaining the state "1". Thus, the threshold voltage does not vary.

Read

In reading of data, a reference voltage of 0V is applied to the control gate of a selected memory cell, whereas a read voltage of VRE is applied to the control gate of a non-selected memory cell. Further, a power voltage of Vcc (3.3V) is applied to all the selection gate. With this operation, all of non-selected memory cells are rendered conductive, and a current flows (state "1") or does not flow ("0") depending upon only the state of the selected memory cell. The flow, or not flow of a current is detected by the sense amplifier.

In reading of data in the conventional EEPROM, the power voltage Vcc is directly used for a voltage applied to the control gate of a non-selected memory cell. The voltage applied to the control gate of the non-selected memory cell must exceed the threshold value of the memory after data has been written. Such a condition is satisfied when Vcc=5V where the threshold voltage of the memory cell in the state "0" is 0.5V to 3.5V, and therefore the non-selected memory cell can serve as a transfer gate. However, when Vcc is lowered to be 3.3V (Vcc=3.3V), the margin of the upper limit of the threshold value of the memory cell is decreased. If the margin is decreased, the read current is decreased, thus delaying the random access time. This results not only in an unsatisfactory performance, but also in a completely erroneous product when the upper limit of the threshold value exceeds Vcc.

Therefore, it is necessary to set the voltage applied to the control gate of a non-selected memory cell to a value exceeding Vcc. There is an upper limit to this set value, and if the upper limit is set excessively high, the threshold value voltage of a memory cell is gradually increased over a long period of time (e.g. 5 to 10 years), possibly causing an erroneous operation (deterioration of read retention).

In this embodiment, a read voltage VRE (VRE=4V) which exceeds the power voltage Vcc but does not exceed a predetermined upper limit, is applied to the control gate of a non-selected memory cell.

FIGS. 10A to 10D are diagrams showing generating circuits for generating control signals SW0–SW7, SE0–SE7, SM0–SM7 and SR0–SR7. For example, an 8-bit control signal for controlling the operation of the EEPROM of this embodiment is supplied via the external terminal 50. The control signal supplied to the external terminal 50 is stored temporarily in an 8-bit register 51. The signal stored in the register 51 is decoded by command detecter 52, and supplied to a control circuit 53. The control circuit 53 controls the normal operation and test operation of the EEPROM.

A write circuit 77 writes control data which indicates a voltage value supplied from a control data supply circuit 78 to a memory circuit 55. The memory circuit 55 consists of memory transistors 71, 72 and 73 each having a floating gate similar to that of the memory cell 11 as a rewritable non-volatile element. The sources of the memory transistors 71, 72 and 73 are connected to a reference voltage of 0V, and the drains are connected to the power voltage Vcc via load resistances 74, 75 and 76. The control gates and drains of the memory transistors 71, 72 and 73 are connected to corresponding write circuits 77, and the write control is carried out by the write circuit 77 as in the case of the above-described data writing operation.

To a decoder 54, 3-bit control data selected from, for example, the sixth bit to eighth bit of a selection circuit 56 and a register 51, by a selection circuit 56, is supplied. The decoder 54 decodes the control data, and generates control signals SW0–SW7, SE0–SE7, SM0–SM7 or SR0–SR7. An inversion signal of each control signal is formed by an inverter (not shown).

FIGS. 11A to 11J are diagrams each showing a control circuit for obtaining the optimum value of the write voltage VPP, storing the optimum value of the control data, and setting the write voltage VPP to the optimum value based on the control data.

A write voltage VPP variable circuit 80 consists of a high voltage generating circuit 17 for generating a write voltage VPP, shown in FIG. 5, a decoder 54 shown in FIG. 10, a memory circuit 55 and a write circuit 77.

A write pulse generating circuit 81 generates a write voltage VPP from the high voltage generating circuit 17 as a pulse voltage having a pulse length of, for example, 10 μs. A sense amplifier 82 is provided for each separate column of the memory cell array 10, and amplifies the potential of a bit line corresponding to a bit line corresponding to each column. A column switch 83 is connected to each of the sense amplifiers 82, and is switched in response to a column selection signal. An input/output data line 84 is connected commonly to the sense amplifiers 82 via the column switches 83.

To a data comparing circuit 85, read data for each column of the memory cell array 10 is supplied to a sense amplifier 82. The data comparing circuit 85 verifies whether or not the supplied data indicates a correct state ("1" or "0"), and outputs an output signal CNO if incorrect (verify:NG), or outputs an output signal CYES if correct (verify:OK). The output signal CNO is supplied to the write pulse generating circuit 81, and a write counting circuit 86. The output signal CNO is input to the write pulse generating circuit 81 as a trigger, and the circuit 81 generates a write voltage VPP from the high voltage generating circuit 17 as a pulse voltage, in order to execute a rewrite (overwrite). The overwrite operation is repeated until the result of verification is detected to be correct. Each time the output signal CNO is output from the data comparing circuit 85, the write counting circuit 86 counts the number of times data is written, starting from an initial value of 1.

When the result of the verification is approved, and an output signal CYES is output from the data comparing circuit 85, the write counting circuit 86 latches the counted value at that time as the number of times of write n.

The data table 87 is a non-volatile memory for maintaining the table shown in FIG. 13. In this table, an optimum value of the write voltage VPP is assigned for each number of times of write n, so as to converge the number of times of write to a predetermined number, (for example, 4 times). For example, an initial value VPPW (an initial value of 18V of the write voltage VPP during the test operation later described) is assigned to the same number of times of write as the above predetermined one. When the number of times of write n is greater than the predetermined one, a voltage higher than the initial value VPPW is assigned so as to decrease the number of times of write. Where $\Delta$ is, for example, 0.5V, VPP=VPPW+$\Delta$ VPP=18.5V is assigned when n=5 or 6, VPP=VPPW+2$\Delta$ VPP=19V is assigned when n=7 or 8, and VPP=VPPW+3$\Delta$ VPP=19.5V when n$\geq$9. When the number of times of write n is smaller than the predetermined one, a voltage lower than the initial value VPPW is assigned so as to increase the number of times of write.

The data of the number of times of write n latched by the write counting circuit 86 is supplied to the data table as an input address signal. The control data corresponding to the number of times of write n is read in the write circuit 77. The write circuit 77 writes the control data in the memory circuit 55. The decoder 54 decodes the control data, and supplies controls signals SW0–SW7 selectively to the voltage generating circuit 24 of the high voltage generating circuit 17. Thus, the output voltage of the boosting circuit 20 is fixedly set to the optimum value of the write voltage VPP corresponding to the number of times of write n.

Figure 11A:
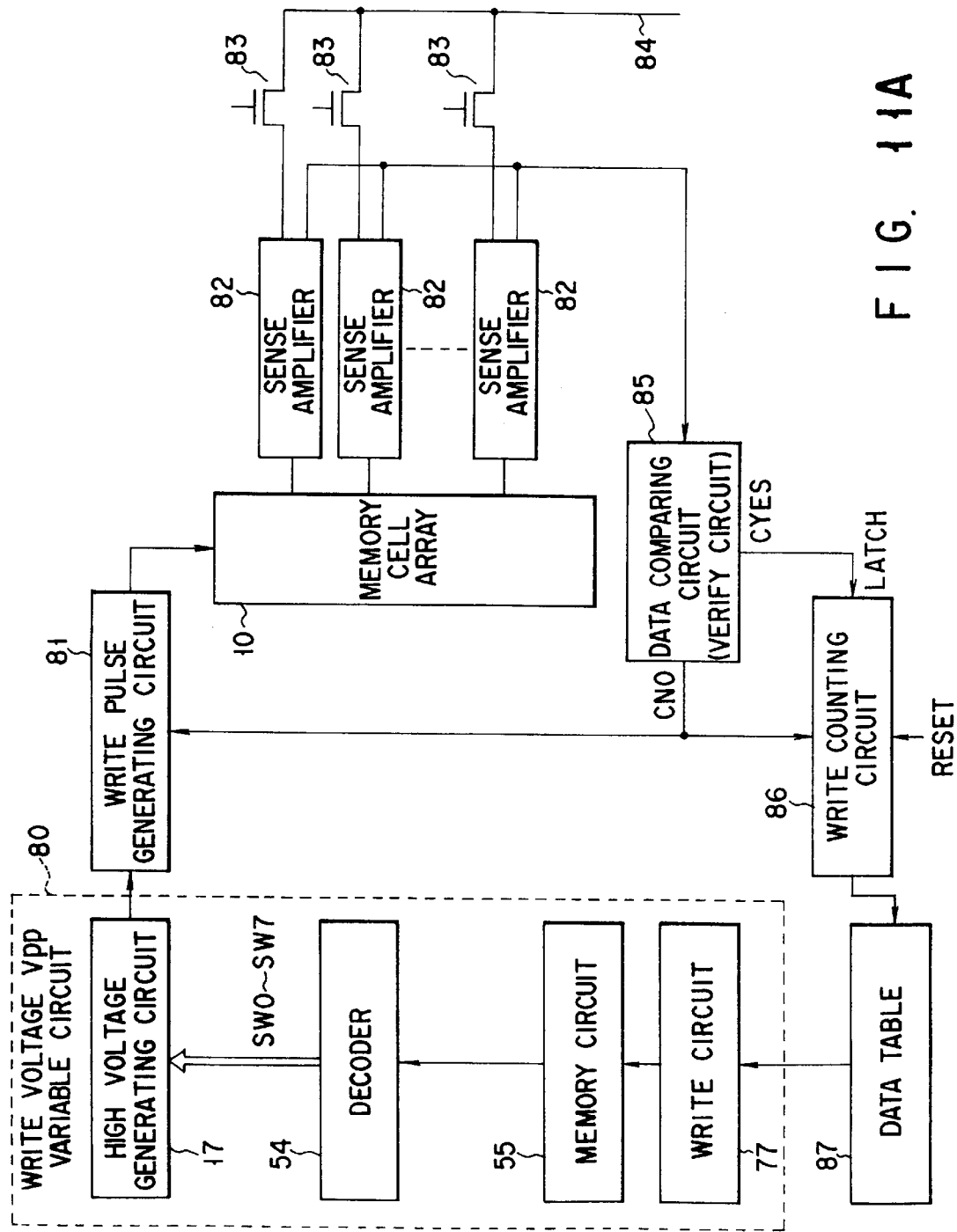
Figure 11B:
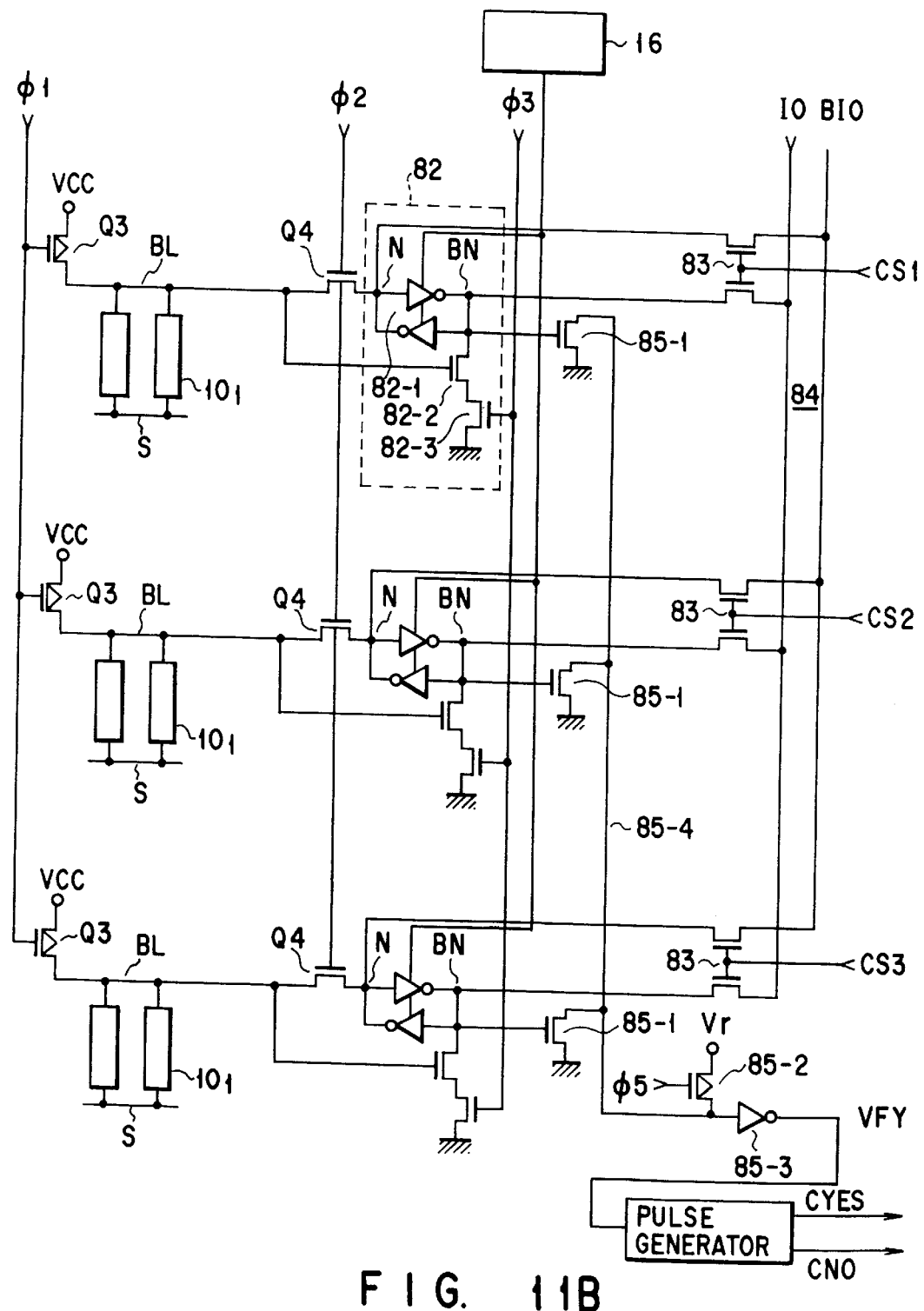
Figure 11E:
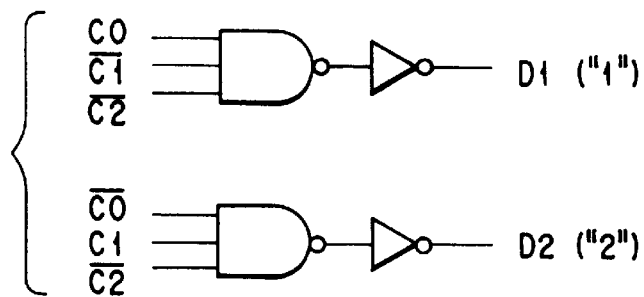

FIG. 11B is a circuit diagram showing a memory cell array 101 for three bit lines, a sense amplifier 82, a data comparing circuit (verifying circuit) 85 and a column switch (column gate) 83, and is associated with a chip-by-chip verify. A flip-flop circuit 82-1 of the sense amplifier 82 temporarily latches write data and read data. Transistors 82-2 and 82-3 are connected in series between a node BN on the IC side of a data input/output line and a ground potential, and constitute a state inverting circuit (data setting circuit). The gate of the transistor 82-2 is connected to a bit line BL and the gate of the transistor 82-3 is connected to a clock $\phi$3.

A common verify line 85-4 of the data comparing circuit 85 is grounded via a transistor 85-1. The gate of the transistor 85-1 is connected to the node BN. For verification, a transistor 85-2 is turned on by a clock $\phi$5, and precharged at a reference voltage Vr. When a write is not completed in any one of the bit lines BL (that is, when a verify is not approved), at least one node N is set at 0V. Consequently, at least one transistor 85-2 is turned on, and the common verify line 85-4 is discharged to be set at 0V. Then, a signal VFY is converted into a reference voltage Vr via a negation circuit 85-3, thus activating an output CNO. When a write is completed in all of the bit lines BL (that is, when a verify is approved), all the nodes N are set at, for example, 5V. Therefore, the transistor 85-2 is turned off, the common verify line 85-4 is maintained at the reference voltage Vr. Then, the signal VFY is set at 0V via the negation circuit 85-3, thus activating an output CYES.

The write pulse generating circuit 82 has a structure as shown in FIG. 11C, and it receives an output CNO from the data comparing circuit 85 as a start pulse, and applies a pulse voltage of VPP to the word line driver 15 via a mirror-type differential amplifying circuit.

Figure 11F:
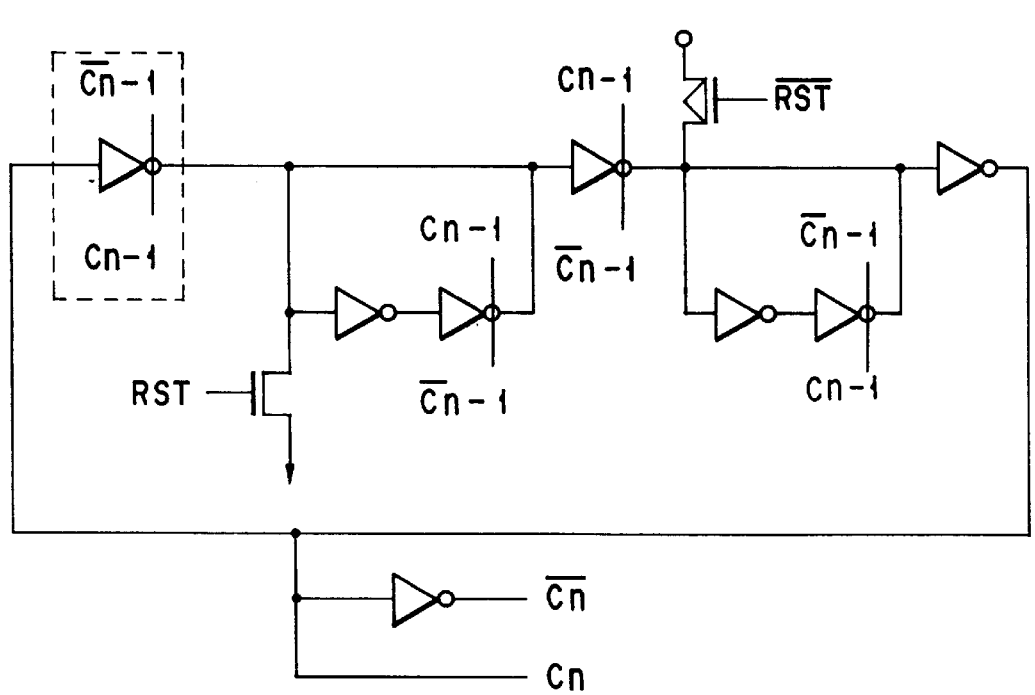
Figure 11G:
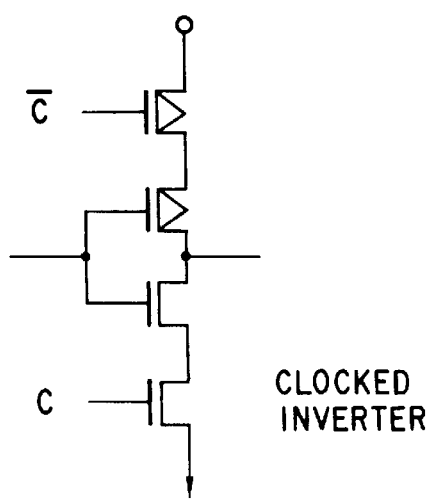

In the counter circuit 86, binary counters such as shown in FIG. 11F are connected in multiple stages as shown in FIG. 11D. When the counter circuit 86 receives an output CYES from the data comparing circuit 85, outputs C and C⁻ of these counters are supplied to a logic circuit system shown in FIG. 11E, and an output D corresponding to the count (the number of times of write) is activated. FIG. 11G shows an example of the negation circuit enclosed by broken lines in FIG. 11F.

Figure 11H:
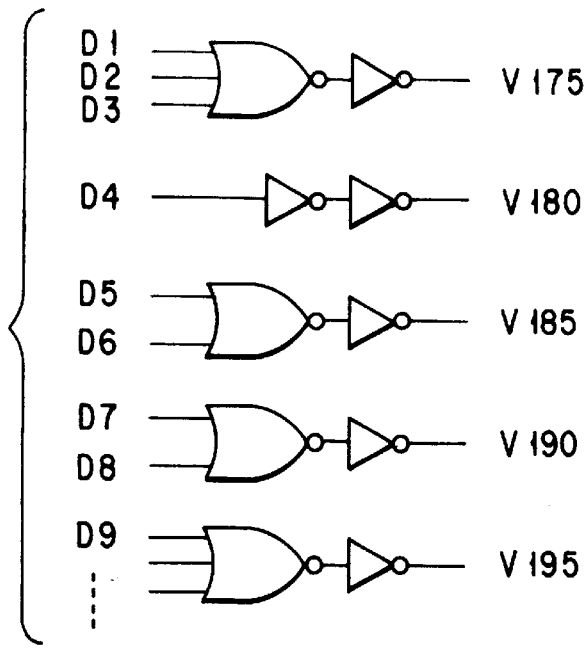
Figure 11I:
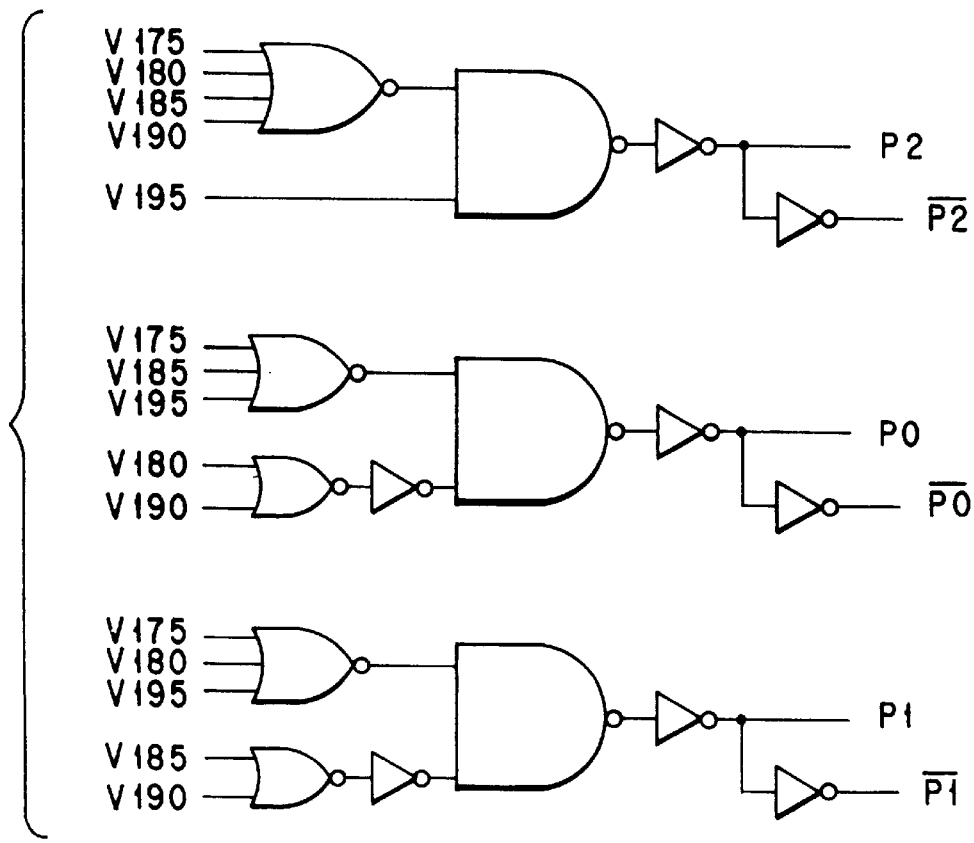

The data table 87 decodes a write voltage corresponding the number of times of write by the logic circuit system shown in FIG. 11H, based on an output Dn (n=1, 2, 3, . . . ) from the counter circuit 86, and outputs this write voltage as 3-bit data Pn and Pn⁻ (n=0, 1, 2) via a bit-conversion system shown in FIG. 11I.

Figure 11J:
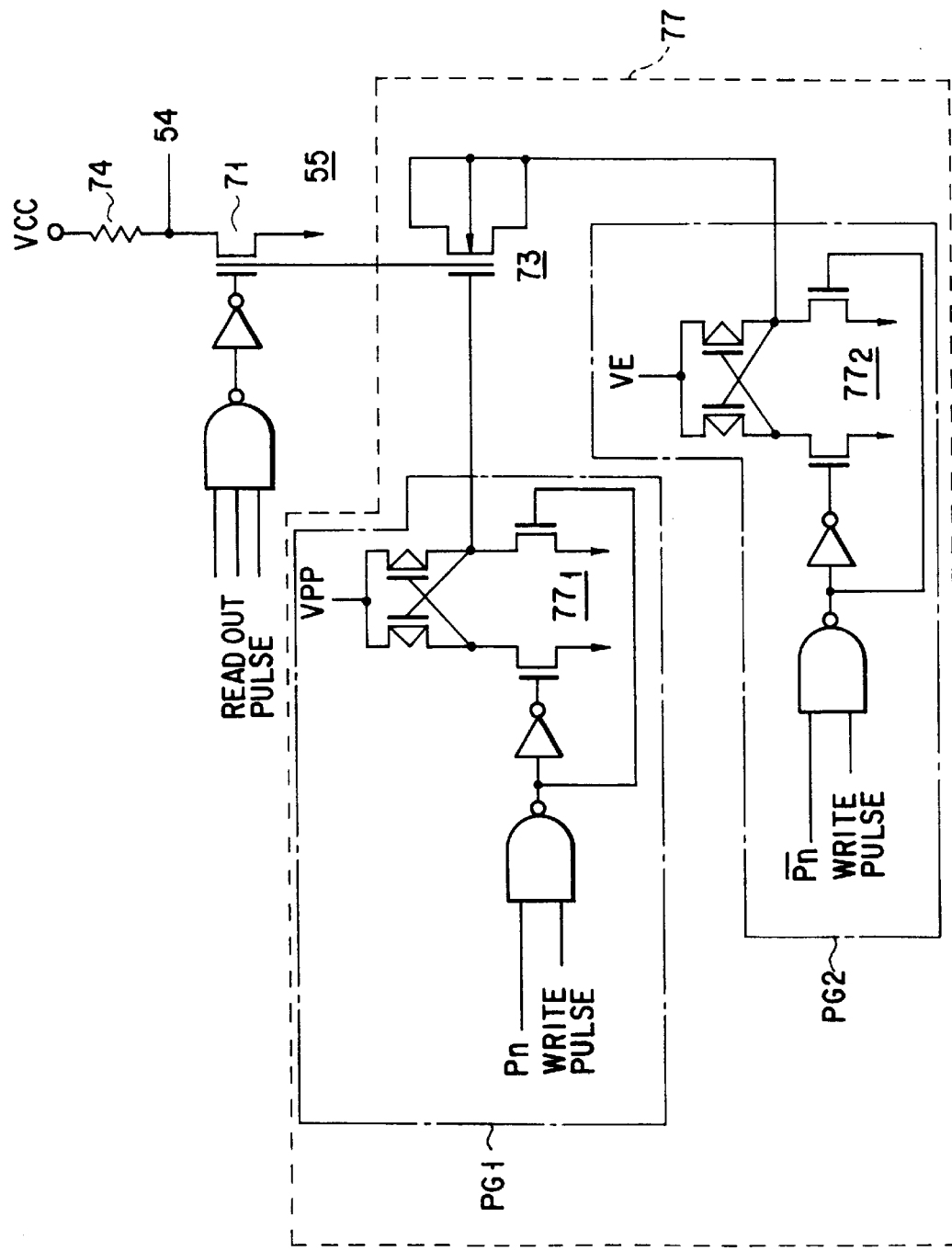

The write circuit 77 has a structure shown in FIG. 11J. The outputs Pn and Pn⁻ from the data table 87 are sent, respectively, to mirror-type differential amplifying circuits 771 and 772. The memory transistor 773 is formed such that its floating gate is shared with the memory transistor 71 (72, 73) of the memory circuit 55. For writing data, the control gate of the memory transistor 773 is set at the write voltage VPP by the mirror-type differential amplifying circuit 771, and the channel of the memory transistor 773 is set at 0V by the mirror-type differential amplifying circuit 771. For erasing the data, the channel of the memory transistor 773 is set at the erase voltage VE by the mirror-type differential amplifying circuit 772, and the control gate of the memory transistor 773 is set at 0V by the mirror-type differential amplifying circuit 771.

FIG. 12 is a flowchart illustrating the test operation for obtaining an optimum value of a write voltage VPP, which is carried out mainly by the control circuit shown in FIG. 11.

First, this operation will be briefly described. Data is written in a memory cell, and after that, data written in the memory cell is read to be verified. Until the result of verification is approved, a series of operations including a write (overwrite), read and verification are repeated. The control data corresponding to the number of times of write n is read from the data table 87. The control data is stored in the memory circuit 55. When writing data in a normal operation, the output voltage (write voltage VPP) of the boosting circuit 20 is set to the optimum value which is indicated by the control data. Thus, when the number of times of write n is greater than a predetermined one (for example, 4 times), the write voltage VPP is raised so as to increase the write performance and thus decrease the number of times of write n. On the other hand, when the number of times of write n is smaller than a predetermined one, the write voltage VPP is fallen so as to decrease the write performance and thus increase the number of times of write n.

With the above operation, the write voltage can be automatically optimized after the device is produced. Further, the revision of the optimum value of the write voltage can be performed easily by replacing the table with another.

Next, the same operation will be described with reference to FIG. 12.

In step S1, the control data indicating the initial value Vppw (for example, Vppw=18V) of the write voltage VPP is stored in a register 51.

In step S2, the output voltage of the boosting circuit 20 is set to the initial value Vppw (18V) based on the control data stored in the register 51.

In step S3, a write pulse of 10 µsec is generated from the write pulse generating circuit 81 at the write voltage Vppw. Thus, the first writing of data is carried out on a memory cell in the unit of page or chip. In this case, the write data may be of a batch write pattern (pattern of all "0" data units), or an input data pattern (combination of "0" data units and "1" data units in accordance with input data). The following description will be made in connection with the batch write pattern.

In step S4, after finishing the write in step S3, data is read out from a memory cell, and verified (compared with "0" data unit). When there is a not-yet-written memory cell in a page or chip, the result of the verification is not approved, and an output signal CNO is output from the data comparing circuit 85. Then, the operation returns to the step S3, and the second writing of data (overwrite) is carried out on the memory cell.

The operations of steps S3 and S4 are repeated until data is written appropriately on all the memory cells, and the result of the verification is approved. When the result of the verification is approved, an output signal CYES is output from the data comparing circuit 85, and the operation moves onto step S5.

In step S5, the number of times of write n is latched in the write counting circuit 86 which receives the output signal CYES. The number of times of write n, supposing that n×10 µsec, corresponds to a time required for the data writing.

In step S6, the data of the number of times of write n is input to the data table 87 as an address. Consequently, the control data indicating the optimum value of the write voltage VPP corresponding to the number of times of write n, is read out, and the read out data is written in the memory circuit 55 via a write circuit 77, thus enabling the data writing at the optimum value in a normal operation.

With the operations described above, the voltage VPP is set at the optimum value.

More preferably, the operations of the steps S1–S6 should be repeatedly performed, with the set optimum value regarded as the initial value, until the number of times of write n becomes smaller than a predetermined one (for example, 4 times), or such a number falls within a range of an upper limit and a lower limit, or the number n coincides with a predetermined one (for example, 4 times). In this case, the table shown in FIG. 14 is used. In this data table, the number of times of write n which coincides with the predetermined number (4 times) is assigned for the initial value VPPW of the write voltage VPP. For the number of times of write n which is less than the predetermined one, a write voltage VPP which is lower than the initial value VPPW by Δ VPP (for example, Δ VPP=0.5V), is assigned so as to increase the number of times of write n. For example, when n=1–3, VPP=VPPW−Δ VPP. For the number of times of write n which is greater than the predetermined one, a write voltage VPP which is higher than the initial value VPPW by Δ VPP is assigned so as to decrease the number of times of write n. For example, when n=5–9, VPP=VPPW+Δ VPP.

As described above, according to the present invention, the write voltage VPP can be automatically optimized based on the number of times of write n, even after the production of the EEPROM.

The optimization of the erase voltage VE for erasing data is carried out in a similar manner to the above-described optimization of the write voltage. That is, the erase of data is carried out at the initial value of the erase voltage VE. After the erasing, data is read out. The read out data is verified if it is equal to the erase data ("1"). When the result of the verification is not approved, the erase of data at the initial value of the erase voltage VE is carried out once again. A series of erasing steps are repeated until the result of the verification is approved. In accordance with the number of times of erase n, the erase voltage VE is optimized. In the control circuit for the above operation, the write pulse generating circuit 81, the write counting circuit 86, the data table 87 and the high voltage generating circuit 17 shown in FIG. 11 are replaced respectively by an erase pulse generating circuit, an erase counting circuit, a data table indicating the correlation between the number of times of erase n and the optimum value of the erase voltage VE, and a high voltage generating circuit 17a, shown in FIG. 7. Thus, the erase voltage VE can be automatically optimized in accordance with the number of times of erase n even after the production of EEPROM.

In the control circuit for optimizing the middle voltage VM, the write pulse generating circuit 81, the data table 87 and the high voltage generating circuit 17 shown in FIG. 11 are replaced respectively by a middle voltage pulse generating circuit, a data table indicating the correlation between the number of times of write n and the erase voltage VE, and a high voltage generating circuit 18 shown in FIG. 8. The write counting circuit 86 may be left as it is. In the data table, the optimum value of the erase voltage VE, which is about ½ of the write voltage VPP, is designated for each of the number of times of write n. Thus, the middle voltage VM can be automatically optimized in accordance with the number of times of write n, even after the production of EEPROM.

In the control circuit for optimizing the read voltage VRE, the write pulse generating circuit 81, the write counting circuit 86, the data table 87 and the high voltage generating circuit 17 shown in FIG. 11 are replaced respectively by a read voltage pulse generating circuit, a read counting circuit, a data table indicating the correlation between the number of times of read n and the read voltage VRE, and a high voltage generating circuit 18a shown in FIG. 9. In the data table, the optimum value of the read voltage VRE is designated for each of the number of times of read n. Thus, the read voltage VM can be automatically optimized in accordance with the number of times of read n, even after the production of EEPROM.

In the above-described embodiment, the power voltage Vcc is set at 3.3V; however, the present invention can be applied also to the case where some other power voltage (for example, 5V) is used.

The optimum value for each of the number of times of write, listed in the data table, should be determined in advance since the value may vary depending upon the thickness of tunnel oxide film of a memory cell, the thickness of film situated between a floating gate and control gate, and a memory cell structure. It is advantageous to employ a rewritable ROM as this data table since the contents of the data table can be easily revised even in the case where the write or erase properties of the memory cell, or the specification thereof are changed.

In the controlling operation described in the above embodiment, the entire operation is automatically carried out within the chip of an EEPROM. However, in the case where the control circuit cannot be set within a chip, a part of the circuit may be omitted in accordance with the necessity, and the controlling operation is partially carried out from the outside of the chip.

In the case where a microcomputer can be, or is actually provided on the chip of the EEPROM, the control function of that part of the control circuit may be executed by software, using such a microcomputer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:

a bit line;

a word line;

a memory cell, having a floating gate and a control gate laminated on a substrate, one of a drain and a source thereof being connected to said bit line, and said control gate being connected to said word line, for maintaining data by varying a threshold value;

a boosting circuit for boosting a power voltage up to an erase voltage;

a verify circuit, connected to said bit line, for verifying data read from said memory cell via said bit line, and outputting a first output signal when the data is incorrect, and outputting a second output signal when the data is correct;

a circuit, connected to an output of said boosting circuit, for applying said erase voltage from said boosting circuit to said substrate upon reception of the first output signal from said verify circuit, to erase the data from said memory cell;

a count circuit, connected to an output terminal of said verify circuit, for counting the number of times of erase by inputting said first output signal, and outputting data of the number of times of erase by inputting said second output signal from said verify circuit;

a data table, connected to an output of said counter, for storing various correlations between the numbers of times of erase and erase voltages and outputting erase voltage data corresponding to data of the number of times of erase;

a memory element, connected to an output of said data table, for storing said erase voltage data;

a write circuit for writing said erase voltage data in said memory element;

a voltage limiting circuit, one terminal of which is connected to an output of said boosting circuit, for varying said erase voltage in accordance with a voltage at the other terminal of said voltage limiting circuit;

a voltage dividing circuit, connected to the other end of said voltage limiting circuit, for dividing the voltage at the other end of said voltage limiting circuit into several voltages; and a control circuit for decoding said erase voltage data of said memory element in an erase mode, and controlling said voltage dividing circuit so as to set said erase voltage at a voltage indicated by said erase voltage data.

2. A semiconductor memory device according to claim 1, wherein said memory cells are connected in series such as to drains and sources are shared, thus constituting a NAND-type memory cell array, control gates of said NAND-type memory cell array are connected to each other to constitute said word line.

3. A semiconductor memory device according to claim 1, wherein said data table stores correlations which normal erase voltage data is corresponded to the normal number of times of erase, erase voltage data higher than normal is corresponded to the number of times of erase smaller than normal, and erase voltage data lower than normal is corresponded to the number of times of erase larger than normal.

4. A semiconductor memory device according to claim 1, wherein said verify circuit includes a verify line connected to the ground via a transistor, a gate of said transistor is supplied a potential of said bit line.

5. A semiconductor memory device according to claim 1, wherein said voltage dividing circuit has a plurality of resistances connected in series between the other end of said voltage limiting circuit and the ground, and a plurality of transfer gates provided between the other end of said voltage limiting circuit and a middle tap of said resistances, and said control circuit supplies an ON signal to one of said plurality of transfer gates based on said erase voltage data, and supplies an OFF signal to all the rest of the transfer gates.

6. A semiconductor memory device according to claim 1, wherein said voltage limiting circuit consists of at least one of Zener diode connected to said boosting circuit in a reverse direction.

7. A semiconductor memory device comprising:

an NAND-type memory cell array in which a plurality of memory cells each having a floating gate and a control gate are connected in series such as to share drains and sources thereof;

a bit line connected to a memory cell at one end of said NAND-type memory cell array, via a control gate;

a plurality of word lines connected respectively to control gates of said plurality of memory cells;

a boosting circuit for boosting a power voltage up to an erase voltage;

a verify circuit, connected to said bit line, for verifying data read from said plurality of memory cells via said bit line, and outputting a first output signal when the data is incorrect and outputting a second output signal when the data is correct;

a circuit, connected to an output of said boosting circuit, for applying said erase voltage from said boosting circuit to a selected one of said word lines upon reception of the first output signal from said verify circuit, so as to erase the data in said memory cell;

a count circuit, connected to an output terminal of said verify circuit, for counting the number of times of erase by inputting said first output signal, and outputting data of the number of times of erase by inputting said second output signal from said verify circuit;

a data table, connected to an output of said counter, for storing various correlations between the numbers of times of erase and erase voltages and outputting erase voltage data corresponding to data of the number of times of erase;

a memory element, connected to an output of said data table, for storing said erase voltage data;

a write circuit for writing said erase voltage data in said memory element;

a voltage limiting circuit, one terminal of which is connected to an output of said boosting circuit, for varying said erase voltage in accordance with a voltage at the other terminal of said voltage limiting circuit;

a voltage dividing circuit, connected to the other end of said voltage limiting circuit, for dividing the voltage at the other end of said voltage limiting circuit into several voltages; and a control circuit for decoding said erase voltage data of said memory element in an erase mode, and controlling said voltage dividing circuit so as to set said erase voltage at a voltage indicated by said erase voltage data.

8. A semiconductor memory device comprising:

a memory cell array having a plurality of nonvolatile memory cells arranged in a matrix;

means for erasing the memory cells during an erase operation with an erasing voltage which is supplied to the memory cells, the erase operation being repeated until erasing is completed;

means for verifying a status of the memory cells; and means for adjusting the erasing voltage in accordance with a number of times the erase operation is repeated by said erasing means until the erasing is completed.

9. A semiconductor memory device according to claim 8, further comprising a nonvolatile data storage for storing data corresponding to the erasing voltage.

10. The device according to claim 8, wherein said erasing means repeats an erase operation until erasing is completed, and said adjusting means adjusts the erasing voltage in accordance with a number of times the erase operation is repeated until the erasing is completed.

11. A semiconductor memory system comprising:

an EEPROM device having nonvolatile cells for receiving data, for storing the data, and for outputting the data, the EEPROM device comprising an erasing circuit for erasing the nonvolatile cells during an erase operation by applying high voltage to the nonvolatile cells, the erase operation being repeated until erasing is completed, and a verifying circuit for verifying the status of the nonvolatile cells; and means for adjusting the high voltage in accordance with a number of times the erase operation is repeated by said erasing circuit until erasing is completed.

12. A semiconductor memory device comprising:

a memory cell;

driving circuitry for applying an erasing voltage to said memory cell during an erase operation, the erase operation being repeated until erasing is completed; and adjusting circuitry for adjusting a voltage level of the erasing voltage in accordance with a number of times the erase operation is repeated until the erasing is completed.

13. A semiconductor memory device comprising:

a memory cell;

driving circuitry for applying an erasing voltage to said memory cell during at least one of a plurality of erase operations; and adjusting circuitry for adjusting a voltage level of the erasing voltage in accordance with a number of the plurality of erase operations, wherein said adjusting circuitry comprises:

a data table for storing data which relates the erasing voltage to the number of the plurality of erase operations.

14. A semiconductor memory device comprising:

a memory cell;

driving circuitry for applying an erasing voltage to said memory cell during at least one of a plurality of erase operations; and adjusting circuitry for adjusting a voltage level of the erasing voltage in accordance with a number of the plurality of erase operations, wherein said adjusting circuitry comprises:

a counting circuit for counting the number of the plurality of erase operations; and a control signal generating circuit for generating control signals for adjusting the erasing voltage based on the number of the plurality of erase operations counted by said counting circuit.

15. A semiconductor memory device comprising:

memory cells;

driving circuitry for applying an erasing voltage to said memory cells during an erase operation for erasing data therefrom;

verifying circuit for verifying that the data is erased from said memory cells; and adjusting circuitry for adjusting the erasing voltage, wherein said semiconductor memory device is operable in a test mode for erasing test data from said memory cells during a test mode erase process in which the erase operation is repeated until said verifying circuitry verifies that the test data is erased from said memory cells, and wherein said adjusting circuitry adjusts the erasing voltage if the number of erase operations required until said verify circuit verifies that the data is erased from said memory cells during a normal mode erase process differs from the number of erase operations required until said verifying circuitry verifies that the test data is erased from said memory cells during the test mode erase process.

* * * * *